United States Patent
Hattori et al.

(10) Patent No.: US 12,308,591 B2
(45) Date of Patent: May 20, 2025

(54) CONNECTION STRUCTURE OF CONDUCTIVE LAYERS, CONDUCTIVE WIRE, COIL AND APPARATUS

(71) Applicant: KABUSHIKI KAISHA TOSHIBA, Tokyo (JP)

(72) Inventors: Yasushi Hattori, Kawasaki Kanagawa (JP); Tomoko Eguchi, Yokohama Kanagawa (JP); Masaya Hagiwara, Yokohama Kanagawa (JP); Keiko Albessard, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 714 days.

(21) Appl. No.: 17/653,952

(22) Filed: Mar. 8, 2022

(65) Prior Publication Data
US 2023/0030881 A1   Feb. 2, 2023

(51) Int. Cl.
*H01R 4/68* (2006.01)
*H01F 6/06* (2006.01)
*H10N 60/85* (2023.01)

(52) U.S. Cl.
CPC ............... *H01R 4/68* (2013.01); *H01F 6/06* (2013.01); *H10N 60/85* (2023.02)

(58) Field of Classification Search
CPC .............. H01R 4/68; H10N 60/85; H01F 6/06
See application file for complete search history.

(56) References Cited

U.S. PATENT DOCUMENTS

| | | |
|---|---|---|
| 2015/0200041 A1 | 7/2015 | Mitsuhashi et al. |
| 2015/0332812 A1* | 11/2015 | Takemoto ............ H10N 60/203 156/280 |
| 2018/0204658 A1 | 7/2018 | Osabe et al. |
| 2020/0028061 A1 | 1/2020 | Nakai et al. |
| 2022/0199887 A1 | 6/2022 | Hagiwara et al. |

(Continued)

FOREIGN PATENT DOCUMENTS

| | | |
|---|---|---|
| JP | S53-67659 A | 6/1978 |
| JP | S54-28753 A | 3/1979 |

(Continued)

*Primary Examiner* — Paul A Wartalowicz
(74) *Attorney, Agent, or Firm* — Finnegan, Henderson, Farabow, Garrett & Dunner, LLP

(57) ABSTRACT

A connection structure of conductive layers according to an embodiment includes: a first conductive member including a first conductive layer and a first substrate, the first conductive member extending in a first direction, the first conductive member curved in the first direction such that the first conductive layer side is convex; a second conductive member including a second conductive layer and a second substrate, the second conductive member extending in the first direction, the second conductive member curved in the first direction such that the second conductive layer side is convex; a third conductive member including a third conductive layer and a third substrate, the third conductive member extending in the first direction; a first connection layer between a the first conductive layer and the third conductive layer, the first connection layer having varying thickness; and a second connection layer between the second conductive layer and the third conductive layer, the second connection layer having varying thickness.

16 Claims, 21 Drawing Sheets

(56) References Cited

U.S. PATENT DOCUMENTS

| | | |
|---|---|---|
| 2022/0302609 A1 | 9/2022 | Hattori et al. |
| 2023/0085118 A1 | 3/2023 | Hagiwara et al. |

FOREIGN PATENT DOCUMENTS

| | | |
|---|---|---|
| JP | 2012-84588 A | 4/2012 |
| JP | 2012-195469 A | 10/2012 |
| JP | 2014-107149 A | 6/2014 |
| JP | 2017-168424 A | 9/2017 |
| JP | 2018-170173 A | 11/2018 |
| JP | 6743653 B2 | 8/2020 |
| JP | 2022-41667 A | 3/2022 |
| JP | 2022-145041 A | 10/2022 |
| JP | 2023-41996 A | 3/2023 |
| WO | WO 2013/165001 A1 | 11/2013 |
| WO | WO 2018/211699 | 11/2018 |
| WO | WO 2022/049800 A1 | 3/2022 |

* cited by examiner

CONNECTION STRUCTURE OF CONDUCTIVE LAYERS, CONDUCTIVE WIRE, COIL AND APPARATUS

CROSS-REFERENCE TO RELATED APPLICATION

This application is based upon and claims the benefit of priority from Japanese Patent Application No. 2021-125021, filed on Jul. 30, 2021, the entire contents of which are incorporated herein by reference.

FIELD

Embodiments described herein relate generally to a connection structure of conductive layers, a conductive wire, a coil, and an apparatus.

BACKGROUND

For example, in a nuclear magnetic resonance apparatus (NMR) or a magnetic resonance imaging apparatus (MRI), a superconducting coil is used to generate a strong magnetic field. The superconducting coil is formed by winding a superconducting wire around a winding frame.

In order to lengthen the superconducting wire, for example, a plurality of superconducting wires are connected. For example, ends of two superconducting wires are connected using a connection structure. The connection structure for connecting superconducting wires is required to have low electric resistance.

DETAILED DESCRIPTION

Figure 1:
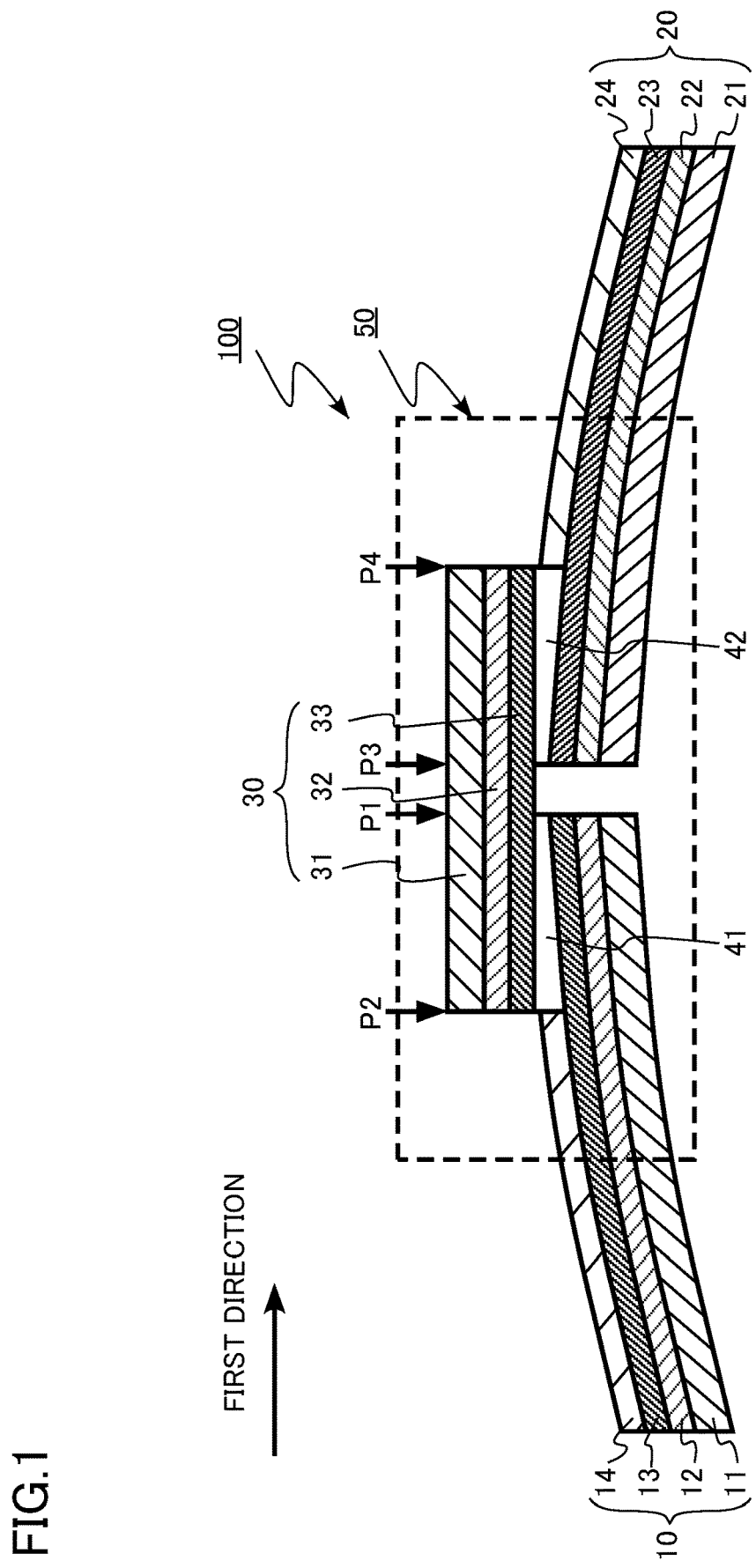
FIG. 1 is a schematic cross-sectional view of a superconducting wire according to a first embodiment.

A connection structure of conductive layers according to an embodiment includes: a first conductive member including a first conductive layer and a first substrate supporting the first conductive layer, the first conductive member extending in a first direction, the first conductive member being curved in the first direction such that the first conductive layer side is convex; a second conductive member including a second conductive layer and a second substrate supporting the second conductive layer, the second conductive member extending in the first direction, the second conductive member being curved in the first direction such that the second conductive layer side is convex; a third conductive member including a third conductive layer and a third substrate, the third conductive layer having a first surface and a second surface facing the first surface, the first surface facing a convex side of the first conductive layer and a convex side of the second conductive layer, the third substrate opposed to the second surface and supporting the third conductive layer, the third conductive member extending in the first direction; a first connection layer existing between a convex side of the first conductive layer and the third conductive layer, the first connection layer having a thickness at a first position thinner than a thickness at a second position, a distance between the second position and the second conductive layer is larger than a distance between the first position and the second conductive layer; and a second connection layer existing between a convex side of the second conductive layer and the third conductive layer, the second connection layer having a thickness at a third position thinner than a thickness at a fourth position, a distance between the fourth position and the first conductive layer is larger than a distance between the third position and the first conductive layer.

Hereinafter, embodiments of the disclosure will be described with reference to the drawings. In the following description, the same or similar members and the like are denoted by the same reference numerals, and the description of members and the like once described may be appropriately omitted.

In the present specification, detection of an element contained in a crystal or the like and measurement of atomic concentration of the element can be performed using, for example, energy dispersive X-ray spectroscopy (EDX) or wavelength dispersive X-ray spectroscopy (WDX). In addition, the substance contained in the particles or the like can be identified using, for example, a powder X-ray diffractometry.

First Embodiment

A connection structure of conductive layers according to a first embodiment includes: a first conductive member including a first conductive layer and a first substrate supporting the first conductive layer, the first conductive member extending in a first direction, the first conductive member being curved in the first direction such that the first conductive layer side is convex; a second conductive member including a second conductive layer and a second substrate supporting the second conductive layer, the second conductive member extending in the first direction, the second conductive member being curved in the first direction such that the second conductive layer side is convex; a third conductive member including a third conductive layer having a first surface facing a convex side of the first conductive layer and a convex side of the second conductive layer and a second surface facing the first surface, and a third substrate opposed to the second surface and supporting the third conductive layer, the third conductive member extending in the first direction; a first connection layer existing between a convex side of the first conductive layer and the third conductive layer, the first connection layer having a thickness at a first position thinner than a thickness at a second position at which a distance from the second conductive layer is longer than that of the first position; and a second connection layer existing between a convex side of the second conductive layer and the third conductive layer, the second connection layer having a thickness at a third position thinner than a thickness at a fourth position at which a distance from the first conductive layer is longer than that of the third position.

In addition, a conductive wire of the first embodiment includes the connection structure of conductive layers of the first embodiment. The conductive wire of the first embodiment is a superconducting wire 100. The connection structure of conductive layers of the first embodiment is a connection structure 50 of superconducting layers. The superconducting wire 100 is an example of a conductive wire. The connection structure 50 of the superconducting layers is an example of the connection structure of conductive layers.

Figure 2:
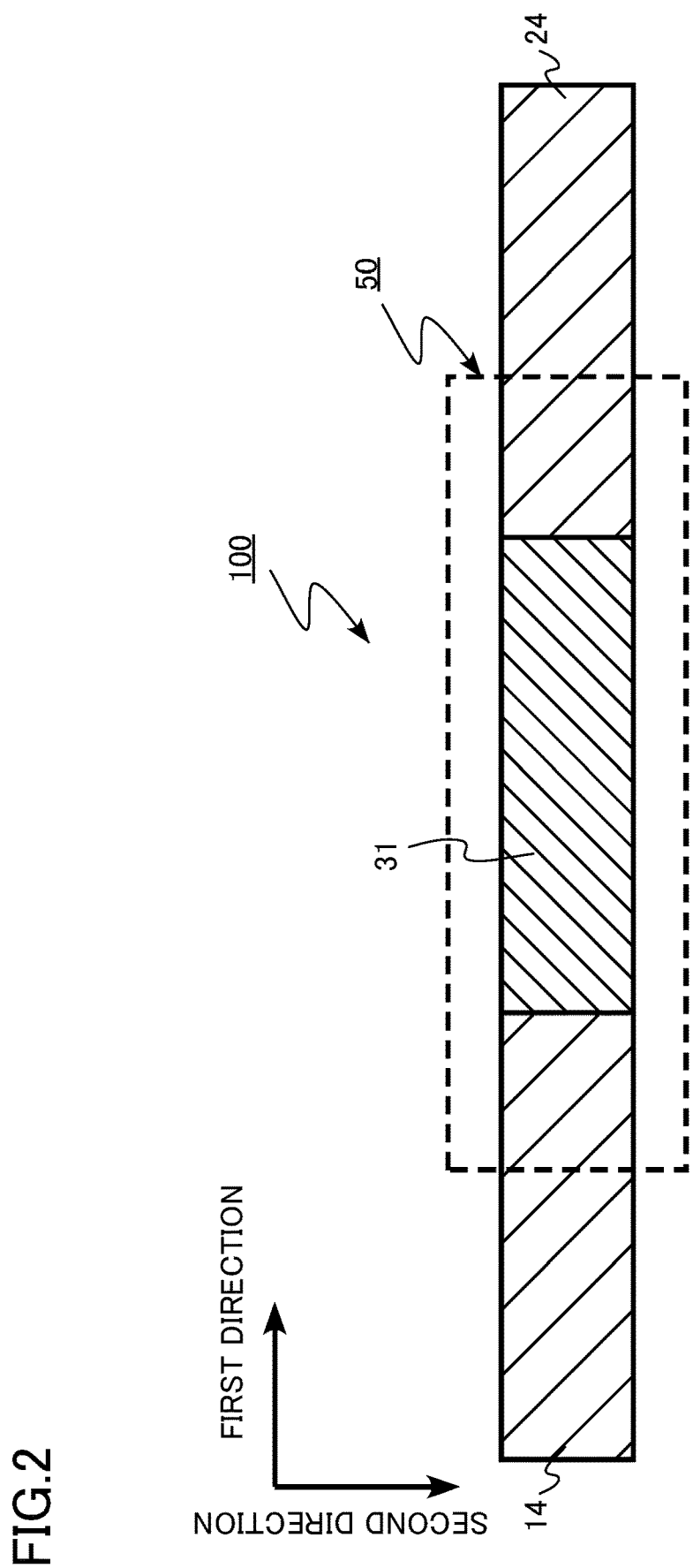
FIG. 2 is a schematic plan view of the superconducting wire of the first embodiment.

FIG. 1 is a schematic cross-sectional view of the superconducting wire of the first embodiment. FIG. 2 is a schematic plan view of the superconducting wire of the first embodiment. FIG. 2 is a plan view of the superconducting wire of the first embodiment as viewed from a third conductive member side.

The superconducting wire 100 includes a first superconducting wire 10, a second superconducting wire 20, and a third superconducting wire 30. The connection structure 50 of the superconducting layers connects the first superconducting wire 10 and the second superconducting wire 20 using the third superconducting wire 30.

The first superconducting wire 10 is an example of the first conductive member. The second superconducting wire 20 is an example of the second conductive member. The third superconducting wire 30 is an example of the third conductive member.

The first superconducting wire 10 extends in the first direction. The second superconducting wire 20 extends in the first direction. The third superconducting wire 30 extends in the first direction. The superconducting wire 100 is elongated in the first direction by connecting the first superconducting wire 10 and the second superconducting wire 20 using the third superconducting wire 30.

The length of the third superconducting wire 30 in a longitudinal direction is shorter than the length of the first superconducting wire 10 in the longitudinal direction, for example. The length of the third superconducting wire 30 in the longitudinal direction is shorter than the length of the second superconducting wire 20 in the longitudinal direction, for example. The third superconducting wire 30 functions as a connection member that connects the first superconducting wire 10 and the second superconducting wire 20.

The length of the first superconducting wire 10 in the longitudinal direction is, for example, 10 cm or more and 500 m or less. The width of the first superconducting wire 10 in a second direction is, for example, 3 mm or more and 20 mm or less. The second direction is a direction orthogonal to the first direction. The second direction is a direction orthogonal to the longitudinal direction of the first superconducting wire 10.

The length of the second superconducting wire 20 in the longitudinal direction is, for example, 10 cm or more and 500 m or less. The width of the second superconducting wire 20 in the second direction is, for example, 3 mm or more and 20 mm or less. The second direction is a direction orthogonal to the longitudinal direction of the second superconducting wire 20.

The length of the third superconducting wire 30 in the longitudinal direction is, for example, 1 cm or more and 5 cm or less. The width of the third superconducting wire 30 in the second direction is, for example, 3 mm or more and 20 mm or less. The second direction is a direction orthogonal to the longitudinal direction of the third superconducting wire 30.

The superconducting wire 100 of the first embodiment includes the connection structure 50. In the connection structure 50, the first superconducting wire 10 and the third superconducting wire 30 are connected. In the connection structure 50, the second superconducting wire 20 and the third superconducting wire 30 are connected.

The first superconducting wire 10 includes a first substrate 11, a first intermediate layer 12, a first superconducting layer 13, and a first protective layer 14. The second superconducting wire 20 includes a second substrate 21, a second intermediate layer 22, a second superconducting layer 23, and a second protective layer 24. The third superconducting wire 30 includes a third substrate 31, a third intermediate layer 32, and a third superconducting layer 33.

The first superconducting layer 13 is an example of a first conductive layer. The second superconducting layer 23 is an example of the second conductive layer. The third superconducting layer 33 is an example of the third conductive layer.

The first substrate 11 is, for example, metal. The first substrate 11 is, for example, a nickel alloy or copper alloy. The first substrate 11 is, for example, a nickel-tungsten alloy.

The first superconducting layer 13 faces the third superconducting layer 33. The first superconducting layer 13 is, for example, an oxide superconducting layer. The first superconducting layer 13 contains, for example, a rare earth element (RE), barium (Ba), copper (Cu), and oxygen (O). The first superconducting layer 13 is, for example, an oxide superconducting layer. The first superconducting layer 13 contains, for example, a crystal containing a rare earth element (RE), barium (Ba), copper (Cu), and oxygen (O). The first superconducting layer 13 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first superconducting layer 13 includes, for example, a single crystal having a perovskite structure.

The first superconducting layer 13 is formed on the first intermediate layer 12 using, for example, a metal organic decomposition method (MOD method), a pulse laser deposition method (PLD method), or a metal organic chemical vapor deposition method (MOCVD method).

The first intermediate layer 12 is provided between the first substrate 11 and the first superconducting layer 13. The first intermediate layer 12 is in contact with, for example, the first superconducting layer 13. The first intermediate layer 12 has a function of improving the crystal orientation of the first superconducting layer 13 formed on the first intermediate layer 12.

The first intermediate layer 12 contains, for example, rare earth oxide. The first intermediate layer 12 has, for example, a stacked structure of a plurality of films. The first intermediate layer 12 has, for example, a structure in which yttrium oxide ($Y_2O_3$), yttria stabilized zirconia (YSZ), and cerium oxide ($CeO_2$) are laminated from the first substrate 11 side.

The first protective layer 14 is provided on the first superconducting layer 13. The first protective layer 14 is in contact with, for example, the first superconducting layer 13. The first protective layer 14 has a function of protecting the first superconducting layer 13.

The first protective layer 14 is, for example, a metal, and the first protective layer 14 contains, for example, silver (Ag) or copper (Cu).

The first superconducting wire 10 is curved in the first direction. The first superconducting wire 10 is curved in the longitudinal direction. The first superconducting wire 10 is curved such that the first superconducting layer 13 side is convex with respect to the first substrate 11. The first superconducting wire 10 is curved such that a side facing the third superconducting wire 30 is convex.

The second substrate 21 is, for example, metal. The second substrate 21 is, for example, a nickel alloy or copper alloy. The second substrate 21 is, for example, a nickel-tungsten alloy.

The second superconducting layer 23 faces the third superconducting layer 33. The second superconducting layer 23 is, for example, an oxide superconducting layer. The second superconducting layer 23 contains, for example, a rare earth element (RE), barium (Ba), copper (Cu), and oxygen (O). The second superconducting layer 23 contains, for example, a crystal containing a rare earth element (RE), barium (Ba), copper (Cu), and oxygen (O). The second superconducting layer 23 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The second superconducting layer 23 includes, for example, a single crystal having a perovskite structure.

The second superconducting layer 23 is formed on the second intermediate layer 22 by, for example, a metalorganic deposition MOD method, a PLD method, or an MOCVD method.

The second intermediate layer 22 is provided between the second substrate 21 and the second superconducting layer 23. The second intermediate layer 22 is in contact with, for example, the second superconducting layer 23. The second intermediate layer 22 has a function of improving the crystal orientation of the second superconducting layer 23 formed on the second intermediate layer 22.

The second intermediate layer 22 contains, for example, rare earth oxide. The second intermediate layer 22 has, for example, a stacked structure of a plurality of films. The second intermediate layer 22 has, for example, a structure in which yttrium oxide ($Y_2O_3$), yttria stabilized zirconia (YSZ), and cerium oxide ($CeO_2$) are laminated from the second substrate 21 side.

The second protective layer 24 is provided on the second superconducting layer 23. The second protective layer 24 is in contact with, for example, the second superconducting layer 23. The second protective layer 24 has a function of protecting the second superconducting layer 23.

The second protective layer 24 is, for example, a metal, and the second protective layer 24 contains, for example, silver (Ag) or copper (Cu).

The second superconducting wire 20 is curved in the first direction. The second superconducting wire 20 is curved in the longitudinal direction. The second superconducting wire 20 is curved such that the second superconducting layer 23 side is convex with respect to the second substrate 21. The second superconducting wire 20 is curved such that a side facing the third superconducting wire 30 is convex.

The third substrate 31 is, for example, a metal. The third substrate 31 is, for example, a nickel alloy or copper alloy. The third substrate 31 is, for example, a nickel-tungsten alloy.

The third superconducting layer 33 has a first surface and a second surface. The second surface faces the first surface.

A convex side of the first superconducting layer 13 and a convex side of the second superconducting layer 23 face the first surface of the third superconducting layer 33. The convex side of the first superconducting layer 13 and the convex side of the second superconducting layer 23 are located on the first surface of the third superconducting layer 33. In FIG. 1, the first surface is a lower surface of the third superconducting layer 33, and the second surface is an upper surface of the third superconducting layer 33. The second surface faces the third substrate 31. The first superconducting layer 13 and the second superconducting layer 23 are located on the lower surface side of the third superconducting layer 33. The third superconducting layer 33 faces the first superconducting layer 13 and the second superconducting layer 23.

The third superconducting layer 33 is, for example, an oxide superconducting layer. The third superconducting layer 33 contains, for example, a rare earth element (RE), barium (Ba), copper (Cu), and oxygen (O). The third superconducting layer 33 contains, for example, a crystal containing a rare earth element (RE), barium (Ba), copper (Cu), and oxygen (O). The third superconducting layer 33 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

The third superconducting layer 33 includes, for example, a single crystal having a perovskite structure.

The third superconducting layer 33 is formed on the third intermediate layer 32 by, for example, the MOD method, the PLD method, or the MOCVD method.

The third intermediate layer 32 is provided between the third substrate 31 and the third superconducting layer 33. The third intermediate layer 32 is in contact with, for example, the third superconducting layer 33. The third intermediate layer 32 has a function of improving the crystal orientation of the third superconducting layer 33 formed on the third intermediate layer 32.

The third intermediate layer 32 contains, for example, rare earth oxide. The third intermediate layer 32 has, for example, a stacked structure of a plurality of films. The third intermediate layer 32 has, for example, a structure in which yttrium oxide ($Y_2O_3$), yttria stabilized zirconia (YSZ), and cerium oxide ($CeO_2$) are laminated from the third substrate 31 side.

The third superconducting wire 30 is not curved in the first direction. The third superconducting wire 30 is not curved in the longitudinal direction.

A first connection layer 41 exists between a convex side of the first superconducting layer 13 and the third superconducting layer 33. The first connection layer 41 is in contact with the first superconducting layer 13. The first connection layer 41 is in contact with the third superconducting layer 33.

The first connection layer 41 connects the first superconducting layer 13 and the third superconducting layer 33. The first connection layer 41 electrically connects the first superconducting layer 13 and the third superconducting layer 33.

The first connection layer 41 is a conductive layer. The first connection layer 41 is, for example, a superconducting layer. The first connection layer 41 is, for example, an oxide superconducting layer. The first connection layer 41 includes, for example, a superconductor.

The first connection layer 41 contains, for example, a rare earth element (RE), barium (Ba), copper (Cu), and oxygen (O). The first connection layer 41 contains, for example, a crystal containing a rare earth element (RE), barium (Ba), copper (Cu), and oxygen (O). The crystal is a rare earth oxide. The crystal is, for example, a single crystal or a polycrystal having a perovskite structure. The crystal has, for example, a chemical composition represented by (RE) $Ba_2Cu_3O_\delta$ (RE is a rare earth element, $6 \leq \delta \leq 7$).

The first connection layer 41 contains, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

A second connection layer 42 exists between a convex side of the second superconducting layer 23 and the third superconducting layer 33. The second connection layer 42 is in contact with the second superconducting layer 23. The second connection layer 42 is in contact with the third superconducting layer 33.

The second connection layer 42 connects the second superconducting layer 23 and the third superconducting layer 33. The second connection layer 42 electrically connects the second superconducting layer 23 and the third superconducting layer 33.

The second connection layer 42 is a conductive layer. The second connection layer 42 is, for example, a superconducting layer. The second connection layer 42 is, for example, an oxide superconducting layer. The second connection layer 42 includes, for example, a superconductor.

The second connection layer 42 contains, for example, a rare earth element (RE), barium (Ba), copper (Cu), and oxygen (O). The second connection layer 42 contains, for example, a crystal containing a rare earth element (RE), barium (Ba), copper (Cu), and oxygen (O). The crystal is a rare earth oxide. The crystal is, for example, a single crystal or a polycrystal having a perovskite structure. The crystal has, for example, a chemical composition represented by (RE) $Ba_2Cu_3O_\delta$ (RE is a rare earth element, $6 \leq \delta \leq 7$).

The second connection layer 42 includes, for example, at least one rare earth element (RE) selected from the group consisting of yttrium (Y), lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

Figure 3:
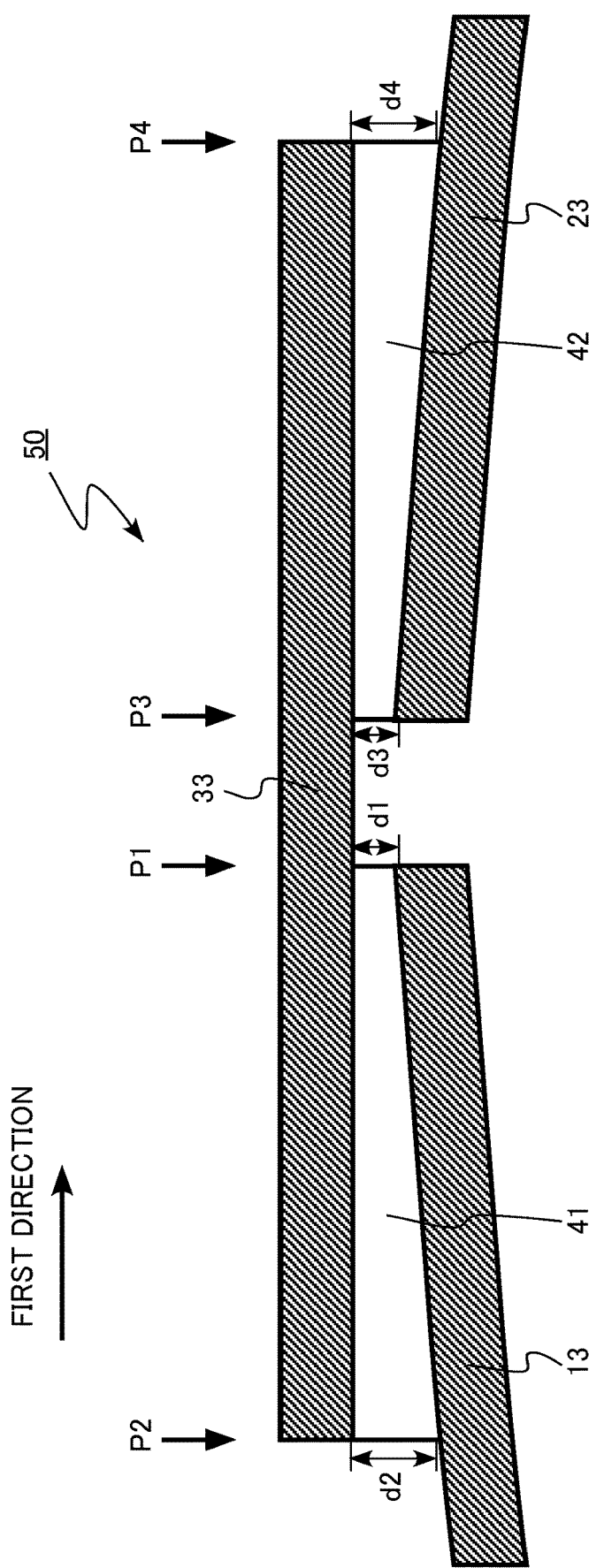
FIG. 3 is a schematic cross-sectional view of a connection structure of superconducting layers of the first embodiment.

FIG. 3 is a schematic cross-sectional view of a connection structure of superconducting layers of the first embodiment. FIG. 3 illustrates only the first superconducting layer 13, the second superconducting layer 23, the third superconducting layer 33, the first connection layer 41, and the second connection layer 42 in the connection structure 50.

The thickness of the first connection layer 41 at the first position is thinner than the thickness of the second position at which the distance from the second superconducting layer 23 is longer than that of the first position. A distance between the second position and the second superconducting layer 23 is larger than a distance between the first position and the second superconducting layer 23. In addition, the thickness of the second connection layer 42 at the third position is thinner than the thickness at the fourth position at which the distance from the first superconducting layer 13 is longer than that of the third position. A distance between the fourth position and the first superconducting layer 13 is larger than a distance between the third position and the first superconducting layer 13.

For example, a position (P1 in FIGS. 1 and 3) between the third superconducting layer 33 and an end of the first superconducting layer 13 on the side facing the second superconducting layer 23 is an example of the first position. In addition, a position (P2 in FIGS. 1 and 3) between the first superconducting layer 13 and an end of the third superconducting layer 33 on the side facing the first superconducting layer 13 is an example of the second position.

For example, a position (P3 in FIGS. 1 and 3) between the third superconducting layer 33 and an end of the second superconducting layer 23 on the side facing the first superconducting layer 13 is an example of the third position. A position (P4 in FIGS. 1 and 3) between the second superconducting layer 23 and an end of the third superconducting layer 33 on the side facing the second superconducting layer 23 is an example of the fourth position.

For example, a thickness (d1 in FIG. 3) of the first connection layer 41 at the position P1 is thinner than a thickness (d2 in FIG. 3) of the first connection layer 41 at the position P2. In addition, for example, a thickness (d3 in FIG. 3) of the position P3 of the second connection layer 42 is thinner than a thickness (d4 in FIG. 3) of the position P4 of the second connection layer 42.

The thickness of the second position of the first connection layer 41 is, for example, twice or more the thickness of the first position of the first connection layer 41. In addition, the thickness of the fourth position of the second connection layer 42 is, for example, twice or more the thickness of the third position of the second connection layer 42.

For example, the thickness d2 of the first connection layer 41 at the position P2 is twice or more the thickness d1 of the first connection layer 41 at the position P1. Further, for example, the thickness d4 of the second connection layer 42 at the position P4 is twice or more the thickness d3 of the second connection layer 42 at the position P3.

For example, the thickness of the first connection layer 41 monotonously increases from the first position toward the second position. Furthermore, for example, the thickness of the second connection layer 42 monotonously increases from the third position toward the fourth position.

For example, the thickness of the first connection layer 41 monotonously increases from the position P1 toward the position P2. Furthermore, for example, the thickness of the second connection layer 42 monotonously increases from the position P3 toward the position P4.

Next, an example of a connection method of superconducting layer according to the first embodiment will be described.

Figure 4:
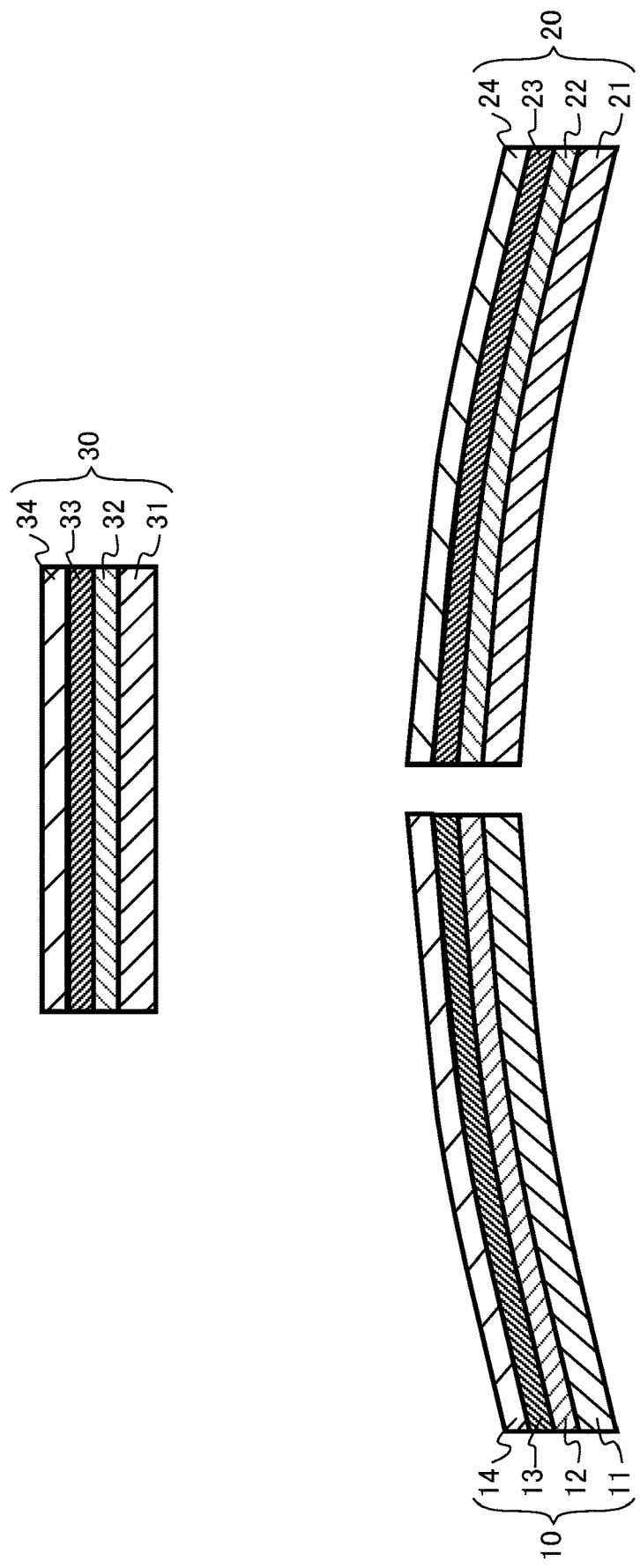
FIG. 4 is an explanatory view of preparation of a first superconducting wire, a second superconducting wire, and a third superconducting wire in a connection method of superconducting layers according to the first embodiment.
Figure 5:
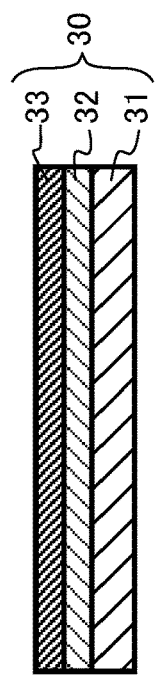
FIG. 5 is an explanatory view of removal of a first protective layer, a second protective layer, and a third protective layer in the connection method of superconducting layers according to the first embodiment.
Figure 5:
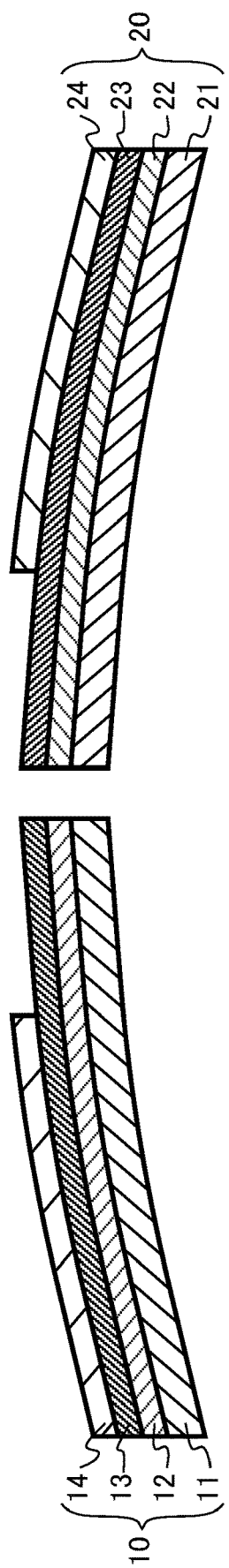
Figure 6:
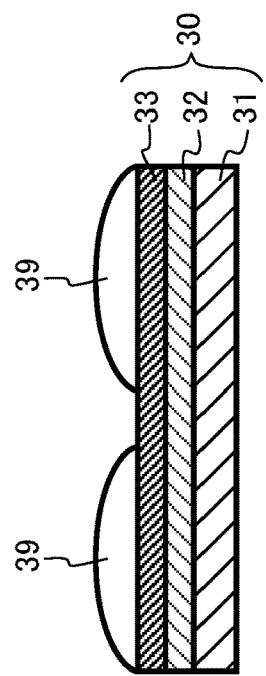
FIG. 6 is an explanatory view of application of a slurry onto a third superconducting layer in the connection method of superconducting layers according to the first embodiment.
Figure 6:
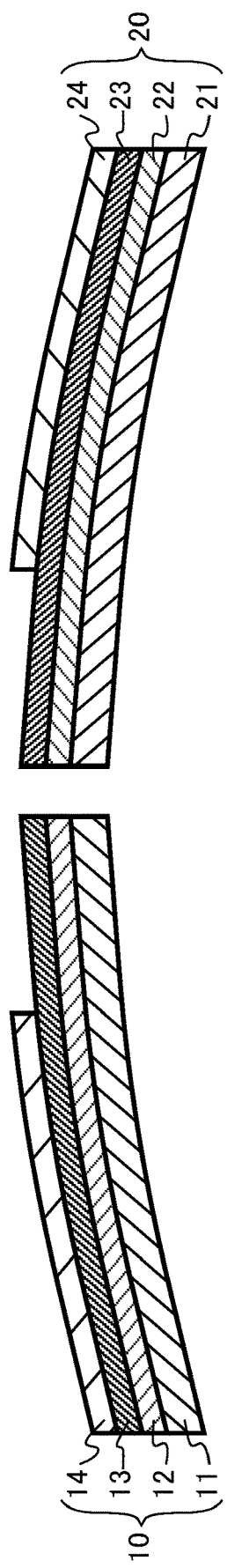
Figure 7:
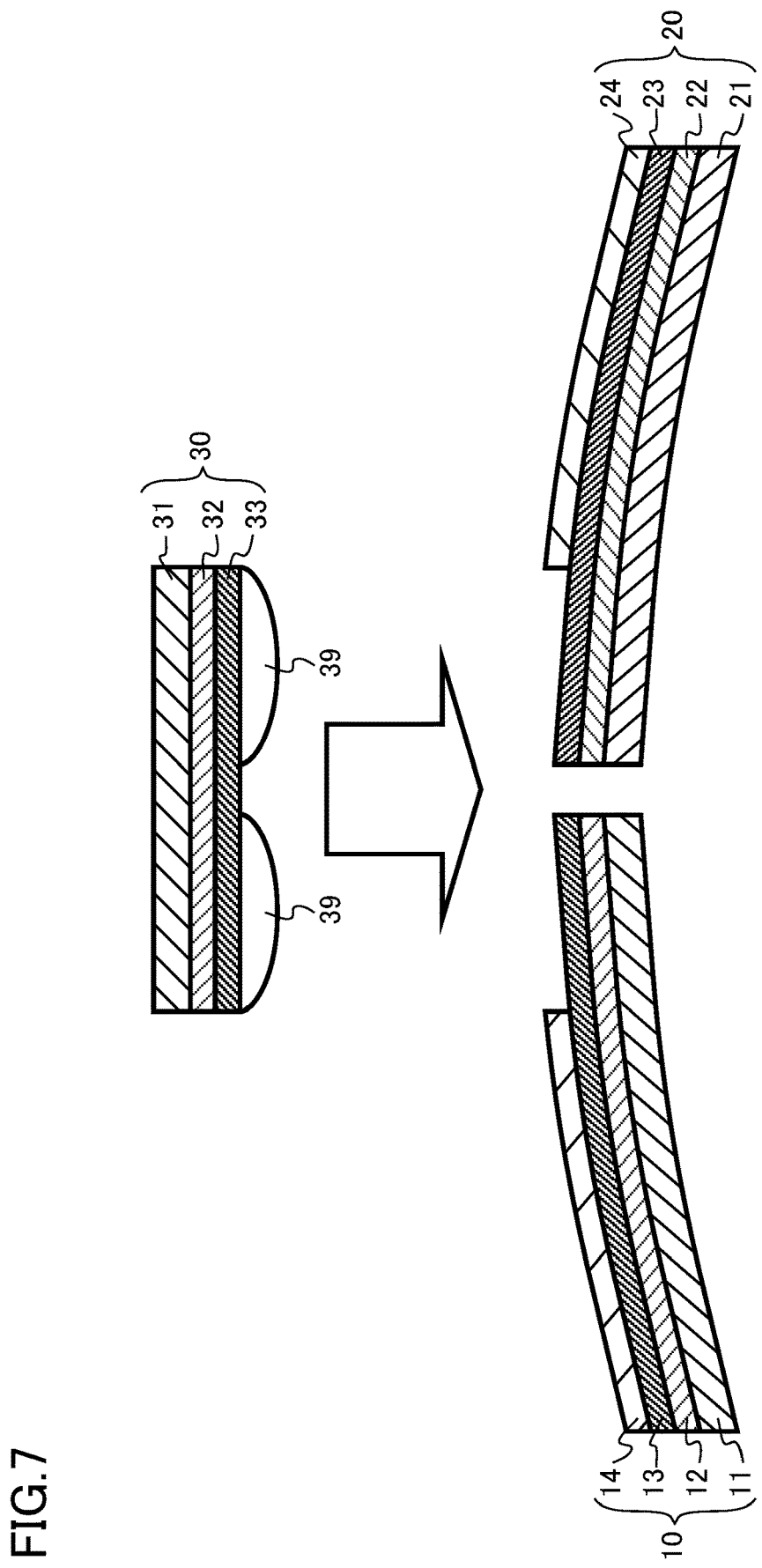
FIG. 7 is an explanatory view of a state in which a first superconducting layer and the third superconducting layer, and a third superconducting layer and the second superconducting layer respectively face each other in the connection method of superconducting layers according to the first embodiment.
Figure 8:
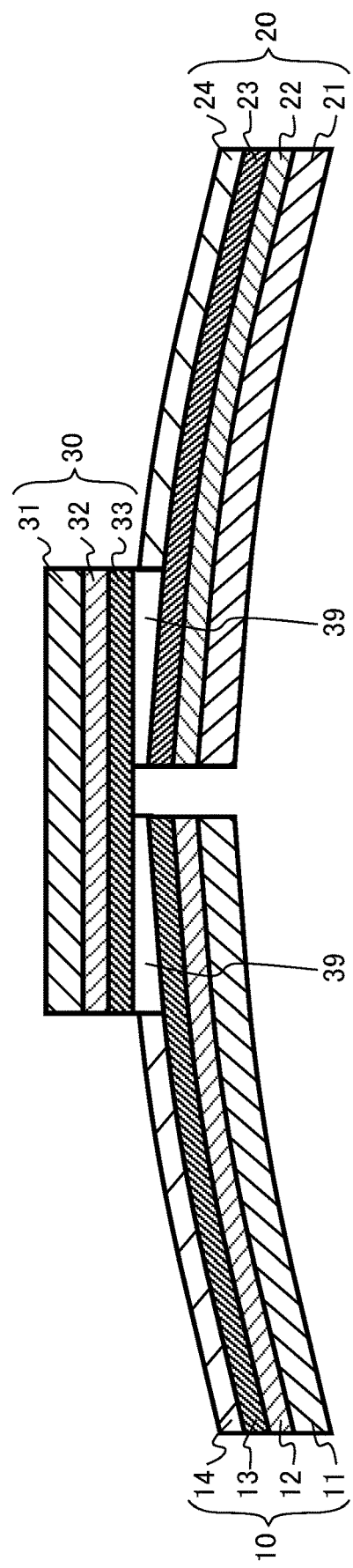
FIG. 8 is an explanatory view of a state in which the first superconducting layer and the third superconducting layer, and the second superconducting layer and the third superconducting layer are respectively superposed in the connection method of superconducting layers according to the first embodiment.
Figure 9:
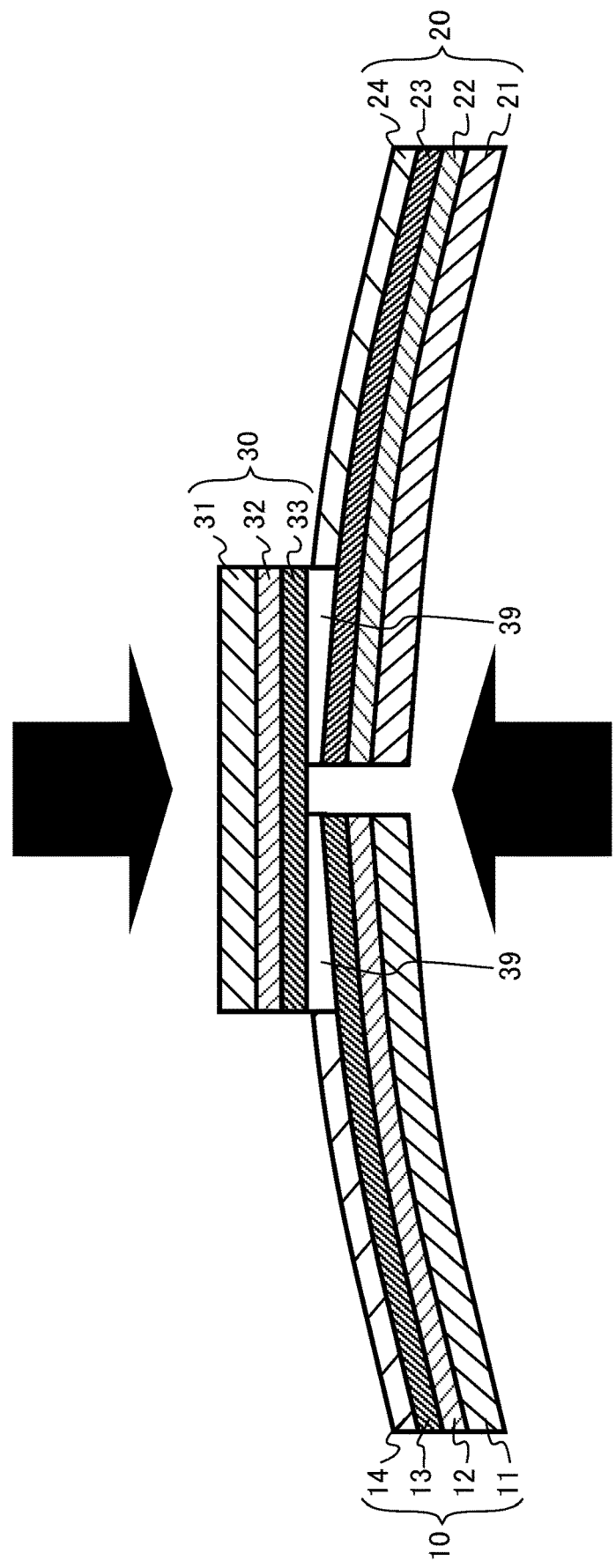
FIG. 9 is an explanatory view of a state in which the first superconducting layer and the third superconducting layer, and the second superconducting layer and the third superconducting layer in the connection method of superconducting layers of the first embodiment are pressurized.

FIGS. 4, 5, 6, 7, 8, and 9 are explanatory views of the connection method of superconducting layers according to the first embodiment. FIG. 4 is an explanatory view of preparation of a first superconducting wire, a second superconducting wire, and a third superconducting wire in the connection method of superconducting layers according to the first embodiment. FIG. 5 is an explanatory view of removal of a first protective layer, a second protective layer, and a third protective layer in the connection method of superconducting layers according to the first embodiment. FIG. 6 is an explanatory view of application of slurry onto a third superconducting layer in the connection method of superconducting layers according to the first embodiment. FIG. 7 is an explanatory view of a state in which the first superconducting layer and the third superconducting layer, and the second superconducting layer and the third superconducting layer face each other in the connection method of superconducting layers according to the first embodiment. FIG. 8 is an explanatory view of a state in which the first superconducting layer and the third superconducting layer, and the second superconducting layer and the third superconducting layer are respectively superposed in the connection method of superconducting layers according to the first embodiment. FIG. 9 is an explanatory view of a state in which the first superconducting layer and the third superconducting layer, and the second superconducting layer and the third superconducting layer in the connection method of superconducting layers of the first embodiment are pressurized.

First, the first superconducting wire 10, the second superconducting wire 20, and the third superconducting wire 30 are prepared (FIG. 4).

The first superconducting wire 10 includes a first substrate 11, a first intermediate layer 12, a first superconducting layer 13, and a first protective layer 14. The second superconducting wire 20 includes the second substrate 21, the second intermediate layer 22, the second superconducting layer 23, and the second protective layer 24. The third superconducting wire 30 includes the third substrate 31, the third intermediate layer 32, the third superconducting layer 33, and the third protective layer 34.

The first superconducting wire 10 is, for example, curved in the longitudinal direction. The second superconducting wire 20 is, for example, curved in the longitudinal direction. The third superconducting wire 30 has, for example, a flat plate shape that is not curved.

Next, the first protective layer 14 on the first superconducting layer 13 is partially removed. In addition, the second protective layer 24 on the second superconducting layer 23 is partially removed. Further, the third protective layer 34 on the third superconducting layer 33 is removed (FIG. 5). The first protective layer 14, the second protective layer 24, and the third protective layer 34 are removed using, for example, a wet etching method.

Next, a slurry 39 is prepared. The slurry 39 contains a rare earth element (RE), barium (Ba), copper (Cu), and oxygen (O).

The slurry 39 contains, for example, particles containing a rare earth element (RE), barium (Ba), copper (Cu), and oxygen (O). In addition, the slurry 39 contains, for example, first particles containing a rare earth element (RE) and oxygen (O), second particles containing barium (Ba) and oxygen (O), and third particles containing copper (Cu) and oxygen (O).

The slurry 39 contains, for example, a sintering aid and a thickener. The sintering aid is, for example, sodium alginate.

Next, the slurry 39 is applied onto the third superconducting layer 33 (FIG. 6).

Next, for example, the third superconducting wire 30 is reversed, and the first superconducting layer 13 and the third superconducting layer 33, and the second superconducting layer 23 and the third superconducting layer 33 are respectively made to face each other with the slurry 39 interposed therebetween (FIG. 7). Then, the first superconducting layer 13 and the third superconducting layer 33, and the second superconducting layer 23 and the third superconducting layer 33 are respectively superposed (FIG. 8).

Next, the superposed first superconducting layer 13 and third superconducting layer 33, and the superposed second superconducting layer 23 and third superconducting layer 33 are pressurized (FIG. 9). For example, a pressure is applied by placing a weight on the overlapped portion. For example, a pressure is applied using a pressing machine. For example, it is also possible to produce a jig for applying a pressure and to apply a pressure by sandwiching the superconducting layers therebetween with the jig. When the jig is used, the jig may be removed after the connection, or the jig may remain attached. When the jig is removed, the coil is easily wound, and thus it is preferable to remove the jig.

When the first superconducting layer 13 and the third superconducting layer 33, and the second superconducting layer 23 and the third superconducting layer 33 are pressurized, the third superconducting wire 30 is prevented from being curved in the longitudinal direction.

Next, a first heat treatment is performed at a first temperature. The first heat treatment is performed in a state where the first superconducting layer 13 and the third superconducting layer 33, and the second superconducting layer 23 and the third superconducting layer 33 are pressurized.

The first temperature is, for example, 500° C. or more and 850° C. or less. The first temperature is preferably 600° C. or more and 800° C. or less, for example. The first heat treatment is performed, for example, at atmospheric pressure. The first heat treatment is performed, for example, in an air atmosphere, an Ar atmosphere, a nitrogen atmosphere, an oxygen atmosphere, a mixed atmosphere of Ar and oxygen, or a mixed atmosphere of nitrogen and oxygen.

By the first heat treatment, the particles in the slurry 39 react or sinter.

By the first heat treatment, for example, an organic substance contained in the slurry 39 is desorbed. By the first heat treatment, for example, carbon (C) contained in the slurry 39 is desorbed.

Next, a second heat treatment is performed at a second temperature. The second heat treatment is performed in an atmosphere containing oxygen. The second heat treatment is performed in an atmosphere having the same oxygen partial pressure as that of the first heat treatment or an oxygen partial pressure higher than that of the first heat treatment. The second heat treatment is performed by oxygen annealing.

The second temperature is, for example, lower than the first temperature. The second temperature is, for example, 400° C. or more and 600° C. or less. The second heat treatment may be performed by cooling the atmosphere to a temperature lower than the second temperature after the first heat treatment, and then reheating the atmosphere to the second temperature. In addition, the second heat treatment may be performed by continuously lowering the temperature to the second temperature after the first heat treatment.

The second heat treatment is performed, for example, in atmospheric pressure. The oxygen partial pressure of the atmosphere at the second heat treatment is, for example, 30% or more.

The first connection layer 41 and the second connection layer 42 are formed by the first heat treatment and the second heat treatment. Crystals of an oxide superconductor are formed in the first connection layer 41 and the second connection layer 42.

The crystals formed in the first connection layer 41 and the second connection layer 42 contain a rare earth element (RE), barium (Ba), copper (Cu), and oxygen (O). The crystal is a rare earth oxide. The crystal is, for example, a single crystal or a polycrystal having a perovskite structure. The crystal has, for example, a chemical composition represented by (RE) $Ba_2Cu_3O_\delta$ (RE is a rare earth element, $6 \leq \delta \leq 7$).

The first superconducting layer 13 and the third superconducting layer 33 are connected by the above method. In addition, the second superconducting layer 23 and the third superconducting layer 33 are connected. The connection structure 50 of the first embodiment is manufactured by the above method.

Instead of the slurry 39, for example, the first connection layer 41 and the second connection layer 42 can be formed using a wedge-shaped crystal of the oxide superconducting layer.

Next, functions and effects of the connection structure 50 of superconducting layers of the first embodiment, and the superconducting wire 100 of the first embodiment will be described.

For example, in a nuclear magnetic resonance apparatus (NMR) or a magnetic resonance imaging apparatus (MRI), a superconducting coil is used to generate a strong magnetic field. The superconducting coil is formed by winding a superconducting wire around a winding frame.

In order to lengthen the superconducting wire, for example, a plurality of superconducting wires are connected. For example, ends of two superconducting wires are connected using a connection structure. The connection structure for connecting superconducting wires is required to have low electric resistance.

Figure 10:
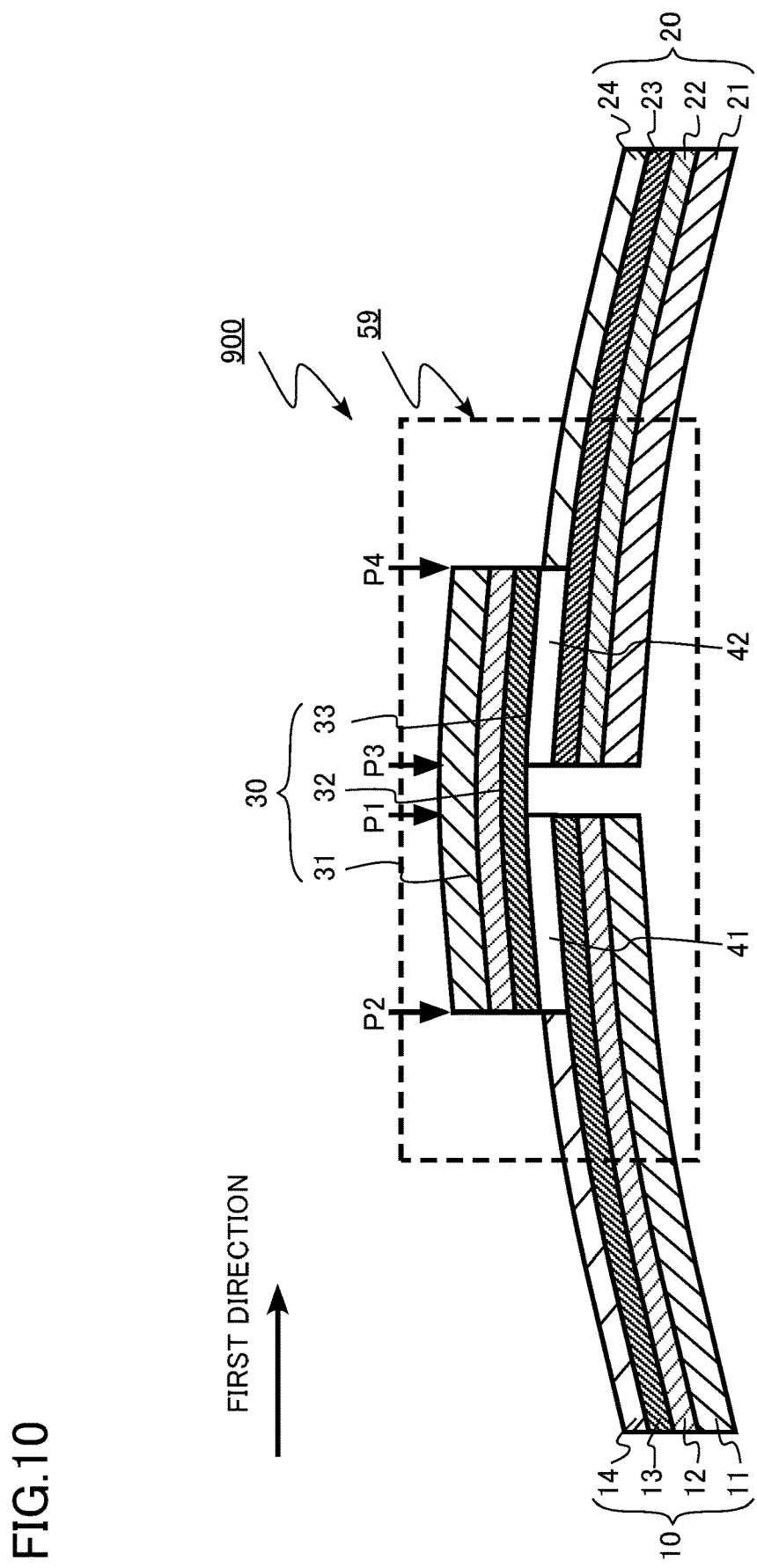
FIG. 10 is a schematic cross-sectional view of a superconducting wire of a comparative example.

FIG. 10 is a schematic cross-sectional view of a superconducting wire of a comparative example. FIG. 10 is a diagram corresponding to FIG. 1.

Figure 11:
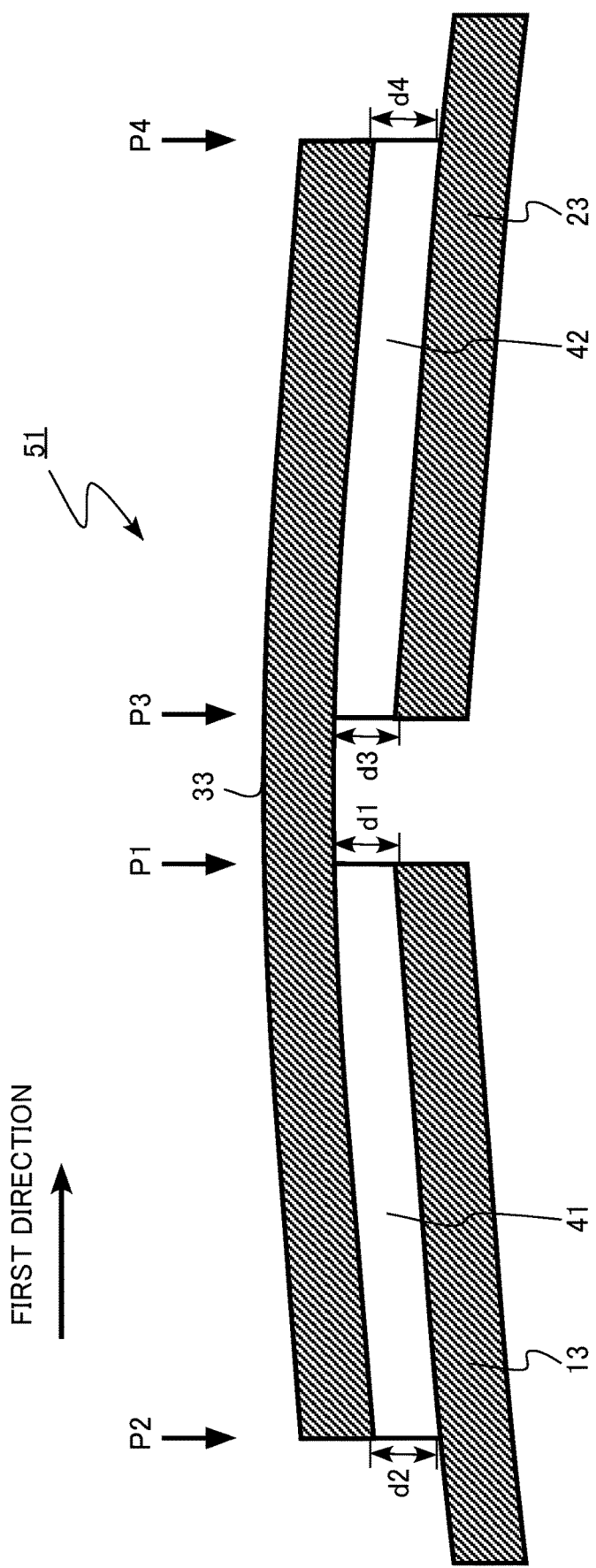
FIG. 11 is a schematic cross-sectional view of a connection structure of superconducting layers of the comparative example.

FIG. 11 is a schematic cross-sectional view of a connection structure of superconducting layers of the comparative example. FIG. 11 is a diagram corresponding to FIG. 3.

A superconducting wire 900 of the comparative example is different from the superconducting wire 100 of the first embodiment in a structure of a connection structure 59 of superconducting layers. The connection structure 59 of superconducting layers of the comparative example is different from the connection structure 50 of superconducting layers of the first embodiment in that the thicknesses of the first connection layer 41 and the second connection layer 42 are constant.

In the connection structure 59 of the comparative example, the thickness of the first connection layer 41 at the first position is equal to the thickness at the second position at which the distance from the second superconducting layer 23 is longer than that of the first position. A distance between the second position and the second superconducting layer 23 is larger than a distance between the first position and the second superconducting layer 23. In addition, the thickness of the second connection layer 42 at the third position is equal to the thickness at the fourth position at which the distance from the first superconducting layer 13 is longer than that of the third position. A distance between the fourth position and the first superconducting layer 13 is larger than a distance between the third position and the first superconducting layer 13.

For example, a thickness (d1 in FIG. 11) of the first connection layer 41 at the position P1 is thinner than a thickness (d2 in FIG. 11) of the first connection layer 41 at the position P2. In addition, for example, the thickness (d3 in FIG. 11) of the second connection layer 42 at the position P3 is equal to the thickness (d4 in FIG. 11) of the second connection layer 42 at the position P4.

Hereinafter, a production of the connection structure 59 of superconducting layers of the comparative example will be described.

When the connection structure 59 of superconducting layers of the comparative example is manufactured, for example, it is assumed that the shape of the prepared third superconducting wire 30 is a flat plate shape that is not curved as in the case of the first embodiment (see FIG. 4).

As described in the method for manufacturing the connection structure 50 of the first embodiment, when the connection structure 59 is manufactured, the superposed first superconducting layer 13 and third superconducting layer 33, and the superposed second superconducting layer 23 and third superconducting layer 33 are respectively heated in a pressurized state (see FIG. 9). In the method for manufacturing the connection structure 59 of the comparative example, when the superposed first superconducting layer 13 and third superconducting layer 33 are pressurized, the shape of the third superconducting layer 33 is pressurized so as to follow the curved shape of the first superconducting layer 13. Similarly, when the superposed second superconducting layer 23 and third superconducting layer 33 are pressurized, the pressure is applied so that the shape of the third superconducting layer 33 follows the curved shape of the second superconducting layer 23.

When the third superconducting layer 33 is pressurized so as to be curved and heated in this state, the bending stress applied to the third superconducting layer 33 increases. As the bending stress applied to the third superconducting layer 33 increases, there is a possibility that crystal distortion or crystal defects occur in the third superconducting layer 33. When crystal distortion or crystal defects occur in the third superconducting layer 33, electric resistance of the third superconducting layer 33 may increase. In addition, there is a possibility that the critical current of the third superconducting layer 33 may decrease.

If the electrical resistance of the connection structure 59 increases or the critical current decreases, for example, the amount of current that can flow into the superconducting wire 900 may decrease, which is a problem. In addition, there is a possibility that a superconducting coil using the superconducting wire 900 may be quenched, which is a problem.

When the connection structure 50 of the first embodiment is manufactured, the third superconducting layer 33 is not curved when the superposed first superconducting layer 13 and third superconducting layer 33 are pressurized. Similarly, when the superposed second superconducting layer 23 and third superconducting layer 33 are pressurized, the third superconducting layer 33 is not curved.

Therefore, bending stress applied to the third superconducting layer 33 is small, and occurrence of crystal distortion and crystal defects in the third superconducting layer 33 is suppressed. Therefore, an increase in electric resistance of the third superconducting layer 33 is suppressed. In addition, a decrease in the critical current of the third superconducting layer 33 is suppressed. Therefore, the connection structure 50 of superconducting layers capable of realizing low electric resistance can be realized. Furthermore, the connection structure 50 of superconducting layers capable of realizing high critical current can be realized.

In the connection structure 50 of superconducting layers, the third superconducting layer 33 is preferably an oxide semiconductor layer. In the oxide semiconductor layer having relatively weak resistance to bending stress, the connection structure 50 of superconducting layers of the first embodiment is particularly effective.

In the connection structure 50 of superconducting layers, the thickness of the first connection layer 41 at the second position is preferably 2 times or more, more preferably 5 times or more, and still more preferably 10 times or more the thickness of the first connection layer 41 at the first position. In addition, in the connection structure 50 of superconducting layers, the thickness of the second connection layer 42 at the fourth position is preferably 2 times or more, more preferably 5 times or more, and still more preferably 10 times or more the thickness of the second connection layer 42 at the third position.

The bending stress applied to the third superconducting layer 33 can be reduced by increasing the thickness at the second position. In addition, the bending stress applied to the third superconducting layer 33 can be reduced by increasing the thickness at the fourth position.

By reducing the thickness at the first position, the electric resistance of the first connection layer 41 can be reduced. In addition, the electric resistance of the second connection layer 42 can be reduced by reducing the thickness at the third position.

In the connection structure 50 of superconducting layers, the thickness d2 of the first connection layer 41 at the position P2 is preferably 2 times or more, more preferably 5 times or more, and still more preferably 10 times or more the thickness d1 of the first connection layer 41 at the position P1. In addition, in the connection structure 50 of superconducting layers, the thickness d4 of the second connection layer 42 at the position P4 is preferably 2 times or more, more preferably 5 times or more, and still more preferably 10 times or more the thickness d3 of the second connection layer 42 at the position P3.

By increasing the thickness d2, the bending stress applied to the third superconducting layer 33 can be reduced. In addition, the bending stress applied to the third superconducting layer 33 can be reduced by increasing the thickness d4.

By reducing the thickness d1, the electric resistance of the first connection layer 41 can be reduced. In addition, the electric resistance of the second connection layer 42 can be reduced by reducing the thickness d3.

Figure 12:
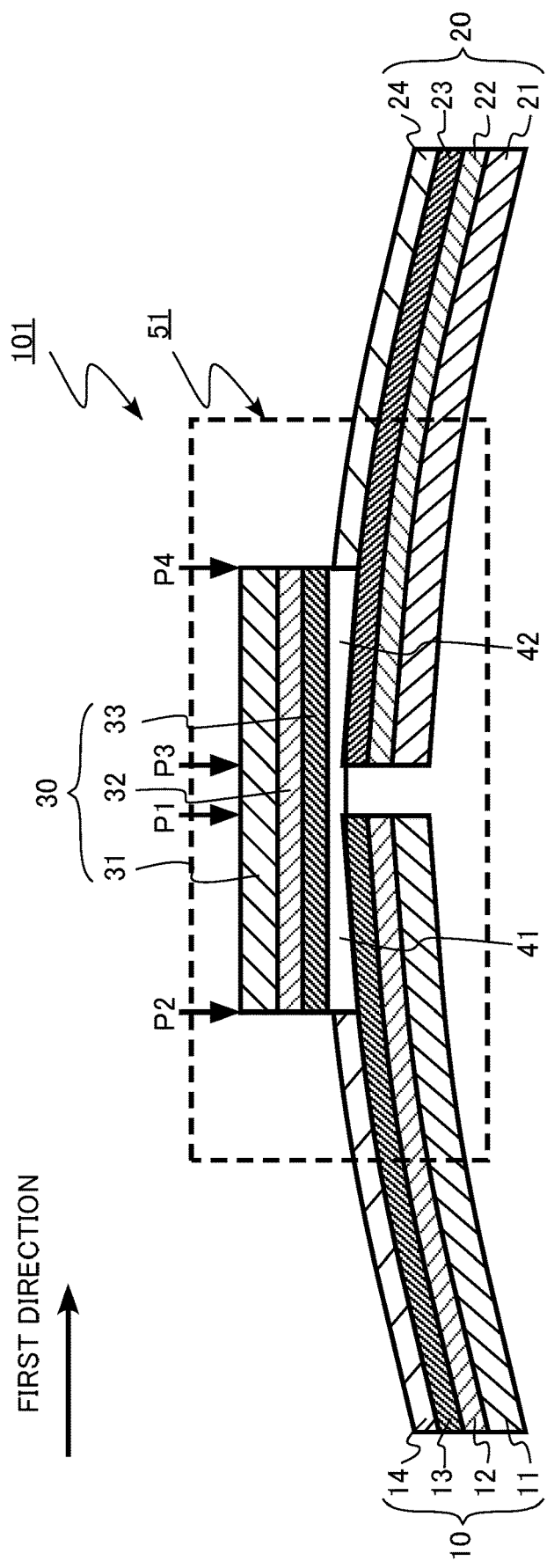
FIG. 12 is a schematic cross-sectional view of a superconducting wire according to the first embodiment.

FIG. 12 is a schematic cross-sectional view of a modification of the superconducting wire of the first embodiment. FIG. 12 is a diagram corresponding to FIG. 1. A modification of the superconducting wire of the first embodiment is a superconducting wire 101. A modification of the connection structure of superconducting layers of the first embodiment is a connection structure 51 of superconducting layers.

Modification

A superconducting wire 101 of a modification is different from the superconducting wire 100 of the first embodiment in that the first connection layer 41 and the second connection layer 42 are continuous. The connection structure 51 of the modification is different from the connection structure 50 of the first embodiment in that the first connection layer 41 and the second connection layer 42 are continuous.

As described above, according to the connection structure of conductive layers, the conductive wire, and the modifications thereof of the first embodiment, low electric resistance can be realized.

Second Embodiment

A connection structure of conductive layers of a second embodiment is different from the connection structure of conductive layers of the first embodiment in that the third conductive member is curved such that the third conductive layer side is concave in the first direction. Hereinafter, description of contents overlapping with the first embodiment may be partially omitted.

A conductive wire of the second embodiment is a superconducting wire 200. The connection structure of conductive layers of the second embodiment is a connection structure 52 of superconducting layers. The superconducting wire 200 is an example of a conductive wire. The connection structure 52 of superconducting layers is an example of the connection structure of conductive layers.

Figure 13:
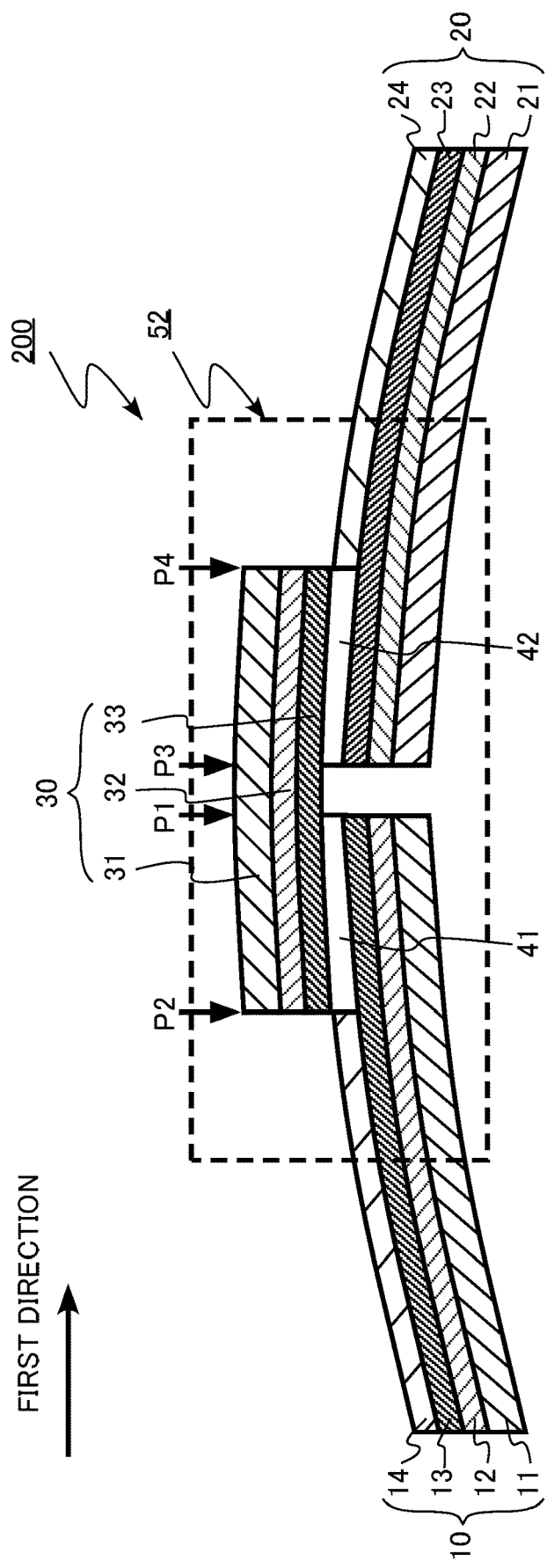
FIG. 13 is a schematic cross-sectional view of a superconducting wire according to a second embodiment.

FIG. 13 is a schematic cross-sectional view of a superconducting wire of the second embodiment.

The superconducting wire 200 includes a first superconducting wire 10, a second superconducting wire 20, and a third superconducting wire 30. The connection structure 52 of superconducting layers connects a first superconducting wire 10 and a second superconducting wire 20 using a third superconducting wire 30.

The thickness of the first connection layer 41 at the first position is thinner than the thickness of the second position at which the distance from the second superconducting layer 23 is longer than that of the first position. A distance between the second position and the second superconducting layer 23 is larger than a distance between the first position and the second superconducting layer 23. In addition, the thickness of the second connection layer 42 at the third position is thinner than the thickness at the fourth position at which the distance from the first superconducting layer 13 is longer than that of the third position. A distance between the fourth position and the first superconducting layer 13 is larger than a distance between the third position and the first superconducting layer 13.

For example, a position (P1 in FIG. 13) between a third superconducting layer 33 and an end of the first superconducting layer 13 on the side facing the second superconducting layer 23 is an example of the first position. A position (P2 in FIG. 13) between the first superconducting layer 13 and an end of the third superconducting layer 33 on the side facing the first superconducting layer 13 is an example of the second position.

For example, a position (P3 in FIG. 13) between the third superconducting layer 33 and an end of the second superconducting layer 23 on the side facing the first superconducting layer 13 is an example of the third position. A position (P4 in FIG. 13) between the second superconducting layer 23 and an end of the third superconducting layer 33 on the side facing the second superconducting layer 23 is an example of the fourth position.

For example, the thickness of the first connection layer 41 at the position P1 is thinner than the thickness of the first connection layer 41 at the position P2. For example, the thickness of the second connection layer 42 at the position P3 is thinner than the thickness of the second connection layer 42 at the position P4.

The first superconducting wire 10 is curved in the first direction. The first superconducting wire 10 is curved in the longitudinal direction. The first superconducting wire 10 is curved such that the first superconducting layer 13 side is convex with respect to the first substrate 11. The first superconducting wire 10 is curved such that a side facing the third superconducting wire 30 is convex.

The second superconducting wire 20 is curved in the first direction. The second superconducting wire 20 is curved in the longitudinal direction. The second superconducting wire 20 is curved such that the second superconducting layer 23 side is convex with respect to the second substrate 21. The second superconducting wire 20 is curved such that a side facing the third superconducting wire 30 is convex.

The third superconducting wire 30 is curved in the first direction. The third superconducting wire 30 is curved in the longitudinal direction. The third superconducting wire 30 is curved such that the third superconducting layer 33 side is concave with respect to the third substrate 31. The third superconducting wire 30 is curved such that the third substrate 31 side is convex. The third superconducting wire 30 is curved such that a side facing the first superconducting wire 10 is concave. The third superconducting wire 30 is curved such that a side facing the second superconducting wire 20 is concave.

The curvature radius of the third superconducting wire 30 is larger than the curvature radius of the first superconducting wire 10, for example. The curvature radius of the third superconducting wire 30 is larger than the curvature radius of the second superconducting wire 20, for example.

When the connection structure 51 of the second embodiment is manufactured, for example, it is assumed that the shape of the third superconducting wire 30 to be prepared is a flat plate shape that is not curved as in the case of the first embodiment (see FIG. 4).

When the connection structure 51 of the second embodiment is manufactured, the degree to which the third superconducting layer 33 is curved when the superposed first superconducting layer 13 and third superconducting layer 33 are pressurized can be made smaller than that of the connection structure 59 of the comparative example. Similarly, when the superposed second superconducting layer 23 and third superconducting layer 33 are pressurized, the degree of curving the third superconducting layer 33 can be made smaller than that of the connection structure 59 of the comparative example.

Therefore, bending stress applied to the third superconducting layer 33 can be reduced, and occurrence of crystal distortion and crystal defects in the third superconducting layer 33 is suppressed. Therefore, the electric resistance of the third superconducting layer 33 is suppressed. In addition, a decrease in the critical current of the third superconducting layer 33 is suppressed. Therefore, the connection structure 52 of superconducting layers capable of realizing low electric resistance can be realized. Furthermore, the connection structure 52 of superconducting layers capable of realizing high critical current can be realized.

As described above, according to the connection structure of conductive layers and the conductive wire of the second embodiment, low electric resistance can be realized.

Third Embodiment

A connection structure of conductive layers of a third embodiment is different from the connection structure of conductive layers of the first embodiment in that the third conductive member is curved such that the third conductive layer side is convex in the first direction. Hereinafter, description of contents overlapping with the first embodiment may be partially omitted.

A conductive wire of the third embodiment is a superconducting wire 300. The connection structure of conductive layers of the third embodiment is a connection structure 53 of superconducting layers. The superconducting wire 300 is an example of a conductive wire. The connection structure 53 of superconducting layers is an example of the connection structure of conductive layers.

Figure 14:
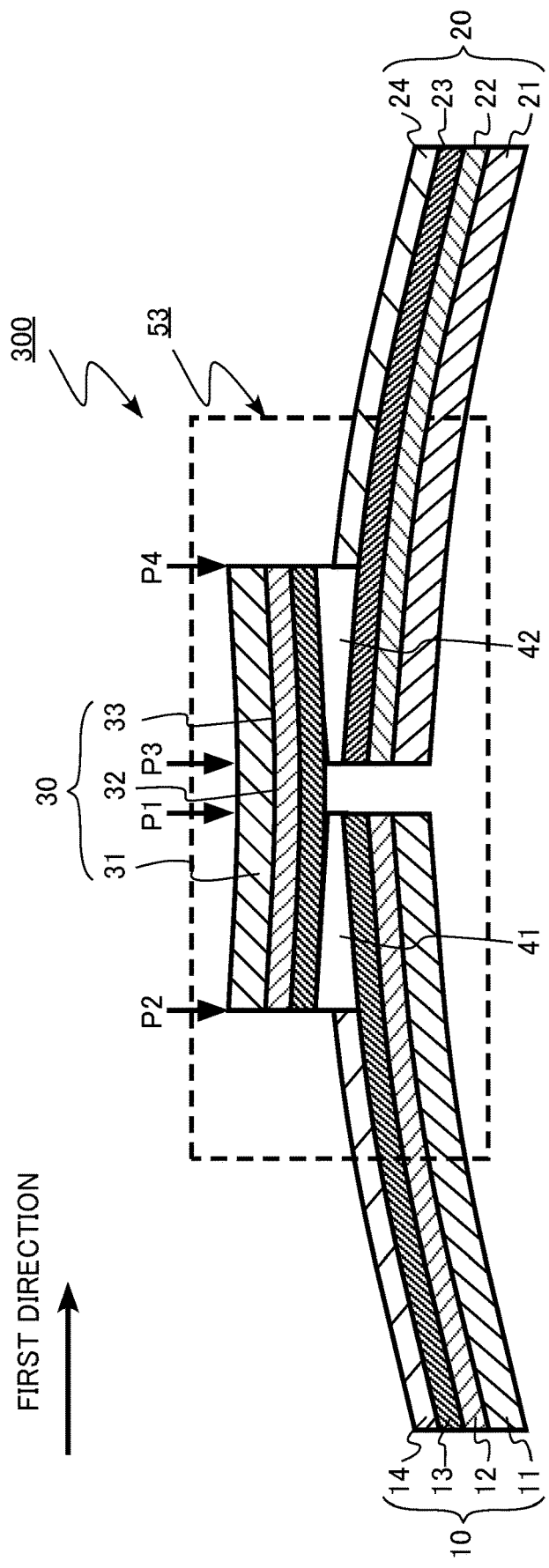
FIG. 14 is a schematic cross-sectional view of a superconducting wire according to a third embodiment.

FIG. 14 is a schematic cross-sectional view of superconducting wire according to a third embodiment.

The superconducting wire 300 includes a first superconducting wire 10, a second superconducting wire 20, and a third superconducting wire 30. The connection structure 53 of superconducting layers connects the first superconducting wire 10 and the second superconducting wire 20 using the third superconducting wire 30.

The thickness of the first connection layer 41 at the first position is thinner than the thickness of the second position at which the distance from the second superconducting layer 23 is longer than that of the first position. A distance between the second position and the second superconducting layer 23 is larger than a distance between the first position and the second superconducting layer 23. In addition, the thickness of the second connection layer 42 at the third position is thinner than the thickness at the fourth position at which the distance from the first superconducting layer 13 is longer than that of the third position. A distance between the fourth position and the first superconducting layer 13 is larger than a distance between the third position and the first superconducting layer 13.

For example, a position (P1 in FIG. 14) between the third superconducting layer 33 and the end of the first superconducting layer 13 on the side facing the second superconducting layer 23 is an example of the first position. In addition, a position (P2 in FIG. 14) between an end of the third superconducting layer 33 on a side facing the first superconducting layer 13 and the first superconducting layer 13 is an example of the second position.

For example, a position (P3 in FIG. 14) between the third superconducting layer 33 and an end of the second superconducting layer 23 on the side facing the first superconducting layer 13 is an example of the third position. In addition, a position (P4 in FIG. 14) between an end portion of the third superconducting layer 33 on a side facing the second superconducting layer 23 and the second superconducting layer 23 is an example of the fourth position.

For example, the thickness of the first connection layer 41 at the position P1 is thinner than the thickness of the first connection layer 41 at the position P2. For example, the thickness of the second connection layer 42 at the position P3 is thinner than the thickness of the second connection layer 42 at the position P4.

The first superconducting wire 10 is curved in the first direction. The first superconducting wire 10 is curved in the longitudinal direction. The first superconducting wire 10 is curved such that the first superconducting layer 13 side is convex with respect to the first substrate 11. The first superconducting wire 10 is curved such that a side facing the third superconducting wire 30 is convex.

The second superconducting wire 20 is curved in the first direction. The second superconducting wire 20 is curved in the longitudinal direction. The second superconducting wire 20 is curved such that the second superconducting layer 23 side is convex with respect to the second substrate 21. The second superconducting wire 20 is curved such that a side facing the third superconducting wire 30 is convex.

The third superconducting wire 30 is curved in the first direction. The third superconducting wire 30 is curved in the longitudinal direction. The third superconducting wire 30 is curved such that the third superconducting layer 33 side is convex with respect to a third substrate 31. The third superconducting wire 30 is curved such that the third substrate 31 side is concave. The third superconducting wire 30 is curved such that a side facing the first superconducting wire 10 is convex. The third superconducting wire 30 is curved such that a side facing the second superconducting wire 20 is convex.

When the connection structure 53 of the third embodiment is manufactured, for example, it is assumed that the shape of the third superconducting wire 30 to be prepared is a shape curved such that the third superconducting layer 33 side is convex with respect to the third substrate 31, similarly to the first superconducting wire 10 and the second superconducting wire 20. That is, for example, it is assumed that the third superconducting wire 30 is manufactured by a manufacturing method in which the third superconducting wire 30 is curved in a same direction as the first superconducting wire 10 and the second superconducting wire 20.

When the connection structure 53 of the third embodiment is manufactured, the degree to which the third superconducting layer 33 is curved when the superposed first superconducting layer 13 and third superconducting layer 33 are pressurized can be made smaller than that of the connection structure 59 of the comparative example. Similarly, when the superposed second superconducting layer 23 and third superconducting layer 33 are pressurized, the degree of curving the third superconducting layer 33 can be made smaller than that of the connection structure 59 of the comparative example.

Therefore, bending stress applied to the third superconducting layer 33 can be reduced, and occurrence of crystal distortion and crystal defects in the third superconducting layer 33 is suppressed. Therefore, the electric resistance of the third superconducting layer 33 is suppressed. In addition, a decrease in the critical current of the third superconducting layer 33 is suppressed. Therefore, the connection structure 53 of superconducting layers capable of realizing low electric resistance can be realized. Furthermore, the connection structure 53 of superconducting layers capable of realizing high critical current can be realized.

As described above, according to the connection structure of conductive layers and the conductive wire of the third embodiment, low electric resistance can be realized.

Fourth Embodiment

A connection structure of conductive layers of a fourth embodiment is different from the connection structure of conductive layers of the first embodiment in that a reinforcing material existing between the first conductive member and the second conductive member is included. Hereinafter, description of contents overlapping with the first embodiment may be partially omitted.

A conductive wire of the fourth embodiment is a superconducting wire 400. The connection structure of conductive layers of the fourth embodiment is a connection structure 54 of superconducting layers. The superconducting wire 400 is an example of a conductive wire. The connection structure 54 of superconducting layers is an example of the connection structure of conductive layers.

Figure 15:
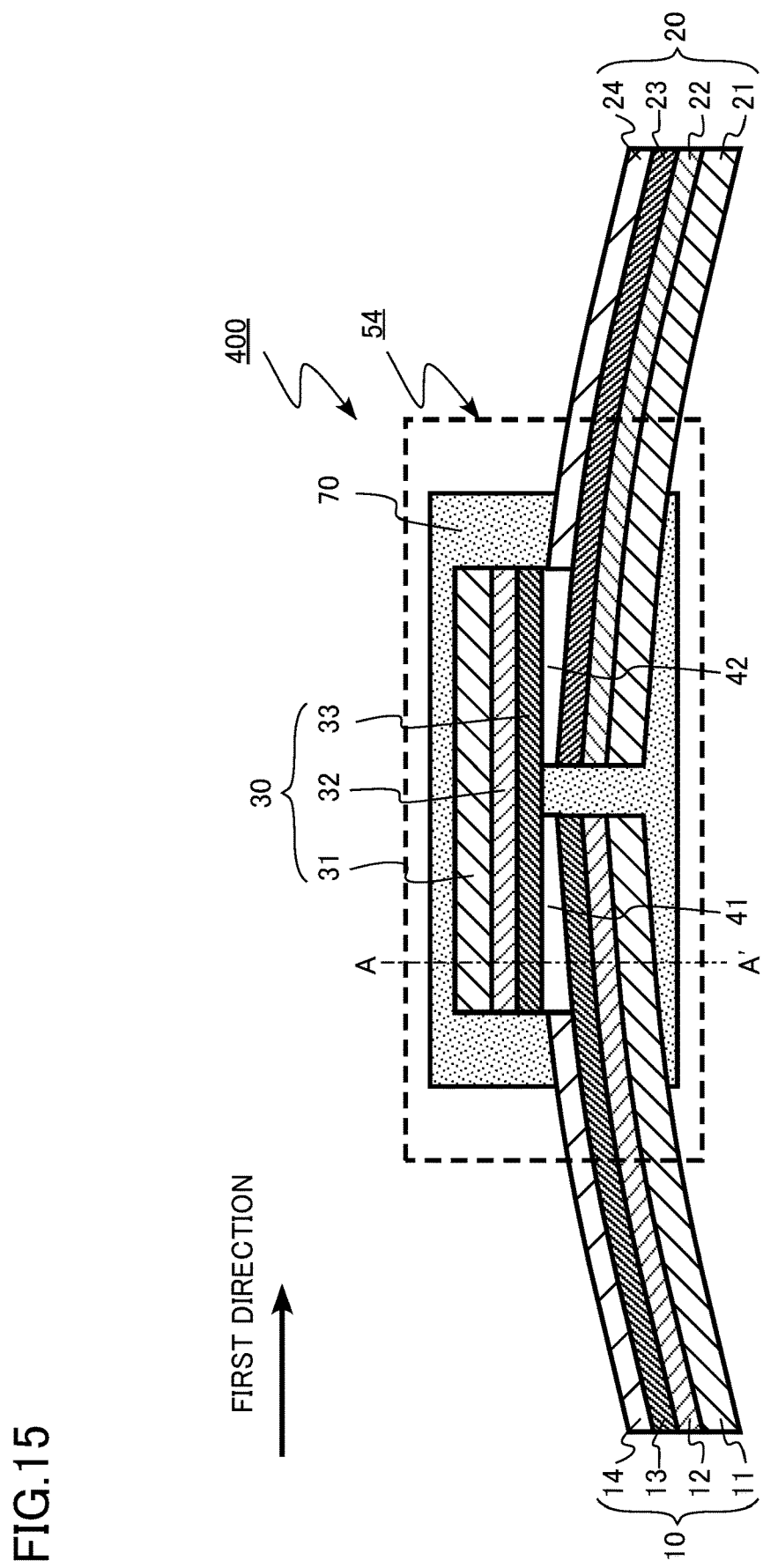
FIG. 15 is a schematic cross-sectional view parallel to a first direction of the superconducting wire of a fourth embodiment.
Figure 16:
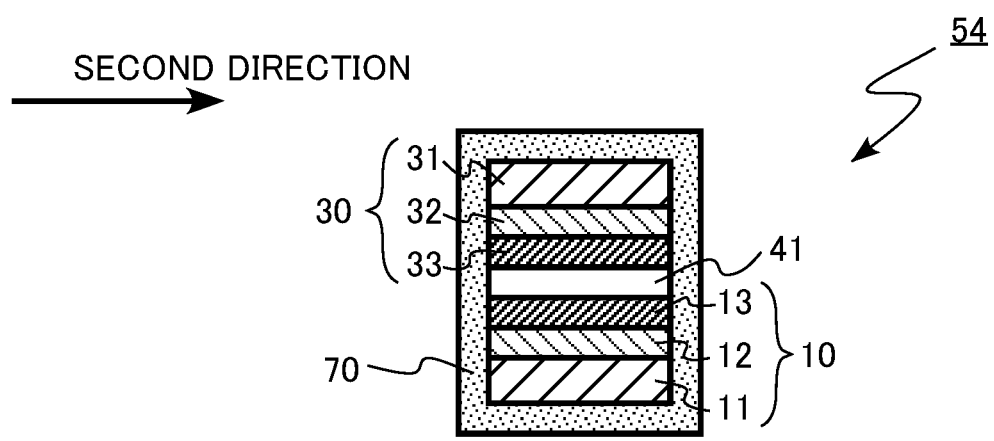
FIG. 16 is a schematic cross-sectional view perpendicular to the first direction of the superconducting wire of the fourth embodiment.

FIG. 15 is a schematic cross-sectional view parallel to the first direction of the superconducting wire of the fourth embodiment. FIG. 16 is a schematic cross-sectional view perpendicular to the first direction of the superconducting wire of the fourth embodiment. FIG. 16 is an AA' cross section of FIG. 15.

The superconducting wire 400 includes a first superconducting wire 10, a second superconducting wire 20, and a third superconducting wire 30. The connection structure 54 of superconducting layers connects the first superconducting wire 10 and the second superconducting wire 20 using the third superconducting wire 30.

The third superconducting wire 30 is not curved in the first direction. The third superconducting wire 30 is not curved in the longitudinal direction.

A reinforcing material 70 is provided on an outer peripheral portion of the connection structure 54 so as to surround the connection structure 54. The reinforcing material 70 has a function of improving the mechanical strength of the connection structure 54.

The reinforcing material 70 is provided between the first superconducting wire 10 and the second superconducting wire 20. The reinforcing material 70 surrounds the first superconducting wire 10, the second superconducting wire 20, and the third superconducting wire 30.

The reinforcing material 70 is, for example, metal or resin. The reinforcing material 70 is, for example, solder. The reinforcing material 70 is, for example, an epoxy resin.

First Modification

A first modification of the superconducting wire of the fourth embodiment is a superconducting wire 401. The first modification of the connection structure of superconducting layers of the fourth embodiment is a connection structure 55 of superconducting layers.

Figure 17:
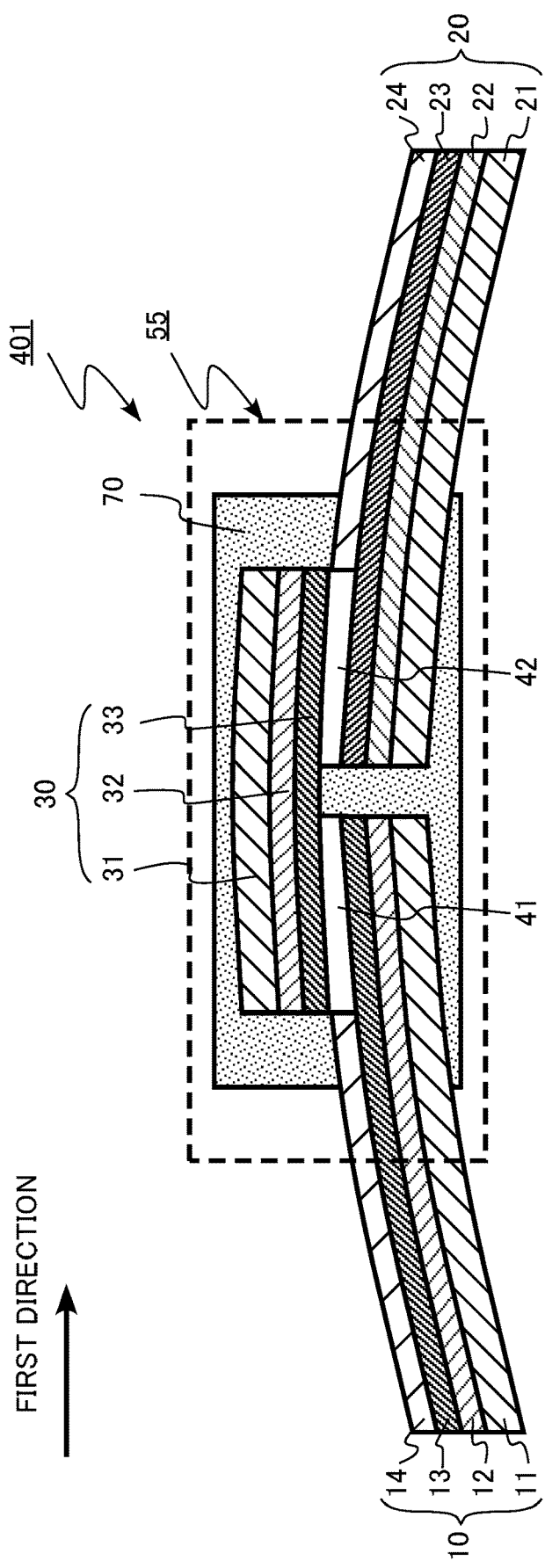
FIG. 17 is a schematic cross-sectional view of a first modification of the superconducting wire of the fourth embodiment.

FIG. 17 is a schematic cross-sectional view of the first modification of the superconducting wire of the fourth embodiment. FIG. 17 is a diagram corresponding to FIG. 15.

A superconducting wire 401 of a first modification is different from the superconducting wire 400 of the fourth embodiment in that the third superconducting wire 30 is curved such that the third superconducting layer 33 side is concave with respect to the third substrate 31. A connection structure 55 of the first modification is different from the connection structure 54 of the fourth embodiment in that the third superconducting wire 30 is curved such that a third superconducting layer 33 side is concave with respect to the third substrate 31.

Second Modification

A second modification of the superconducting wire of the fourth embodiment is a superconducting wire 402. The second modification of the connection structure of superconducting layers of the fourth embodiment is a connection structure 56 of superconducting layers.

Figure 18:
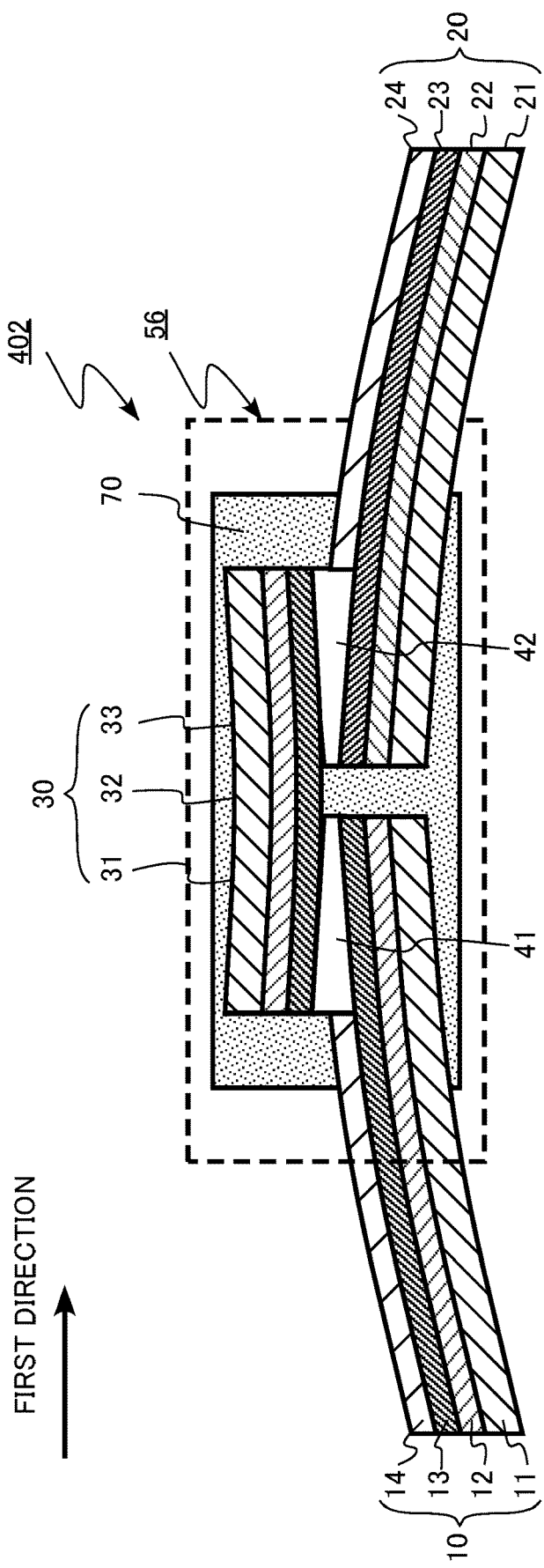
FIG. 18 is a schematic cross-sectional view of a second modification of the superconducting wire of the fourth embodiment.

FIG. 18 is a schematic cross-sectional view of a second modification of the superconducting wire of the fourth embodiment. FIG. 18 is a diagram corresponding to FIG. 15.

The superconducting wire 402 of the second modification is different from the third superconducting wire 400 of the fourth embodiment in that the superconducting wire 30 is curved such that the third superconducting layer 33 side is convex with respect to the third substrate 31. The connection structure 56 of the second modification is different from the connection structure 54 of the fourth embodiment in that the third superconducting wire 30 is curved such that the third superconducting layer 33 side is convex with respect to the third substrate 31.

As described above, according to the connection structure of conductive layers, the conductive wire, and the modifications thereof of the fourth embodiment, low electric resistance can be realized.

Fifth Embodiment

A coil of a fifth embodiment includes the conductive wire of the first to fourth embodiments. Hereinafter, description of contents overlapping with the first to fourth embodiments may be partially omitted.

The coil of the fifth embodiment is a superconducting coil 700. The superconducting coil 700 is an example of a coil.

Figure 19:
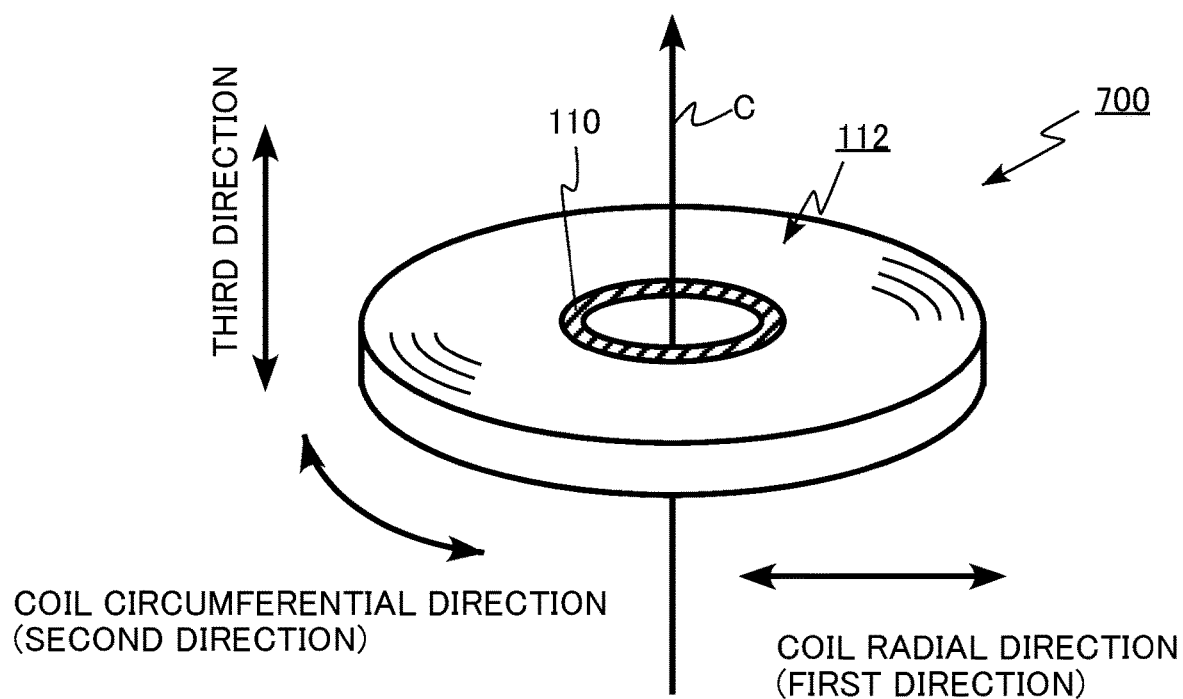
FIG. 19 is a schematic perspective view of a superconducting coil of a fifth embodiment.
Figure 20:
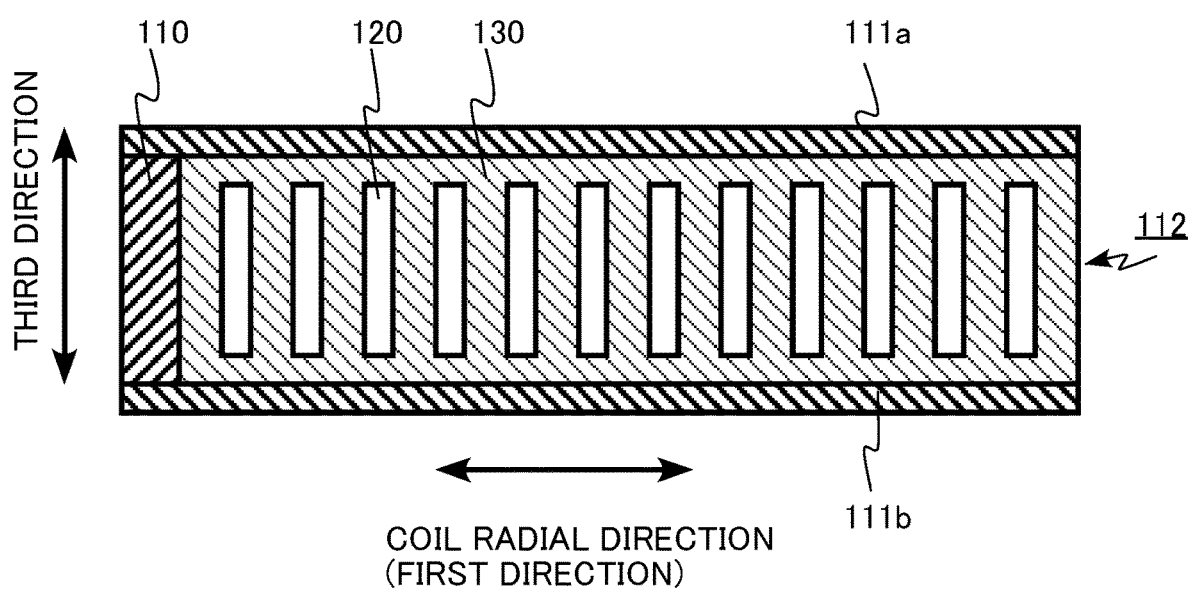
FIG. 20 is a schematic cross-sectional view of the superconducting coil of the fifth embodiment.

FIG. 19 is a schematic perspective view of the superconducting coil of the fifth embodiment. FIG. 20 is a schematic cross-sectional view of the superconducting coil of the fifth embodiment.

The superconducting coil 700 is used as, for example, a coil for generating a magnetic field of a superconducting apparatus such as NMR, MRI, a heavy particle radiotherapy apparatus, or a superconducting maglev.

The superconducting coil 700 includes a winding frame 110, a first insulating plate 111a, a second insulating plate 111b, and a winding portion 112. The winding portion 112 includes superconducting wires 120 and a wire interlayer 130.

FIG. 19 illustrates a state in which the first insulating plate 111a and the second insulating plate 111b are removed.

The winding frame 110 is made of, for example, fiber-reinforced plastic. The superconducting wires 120 have, for example, a tape shape. As illustrated in FIG. 19, the superconducting wire 120 is wound around the winding frame 110 in a concentric, so-called pancake shape around a winding center C.

The wire interlayer 130 has a function of fixing the superconducting wires 120. The wire interlayer 130 has a function of suppressing destruction of the superconducting wires 120 due to vibration during use of the superconducting apparatus, or friction between the superconducting wires.

The first insulating plate 111a and the second insulating plate 111b are made of, for example, fiber-reinforced plastic.

The first insulating plate 111a and the second insulating plate 111b have a function of insulating the winding portion 112 from the outside. The winding portion 112 is located between the first insulating plate 111a and the second insulating plate 111b.

As the superconducting wire 120, the superconducting wires of the first to fourth embodiments are used.

As described above, according to the fifth embodiment, a superconducting coil with improved characteristics can be realized by including a superconducting wire having low electric resistance.

Sixth Embodiment

An apparatus of the sixth embodiment is an apparatus including the coil of the fifth embodiment. Hereinafter, description of contents overlapping with the sixth embodiment will be partially omitted.

The apparatus of the sixth embodiment is a superconducting apparatus. The superconducting apparatus of the sixth embodiment is a heavy particle radiotherapy apparatus 800. The heavy particle radiotherapy apparatus 800 is an example of the apparatus.

Figure 21:
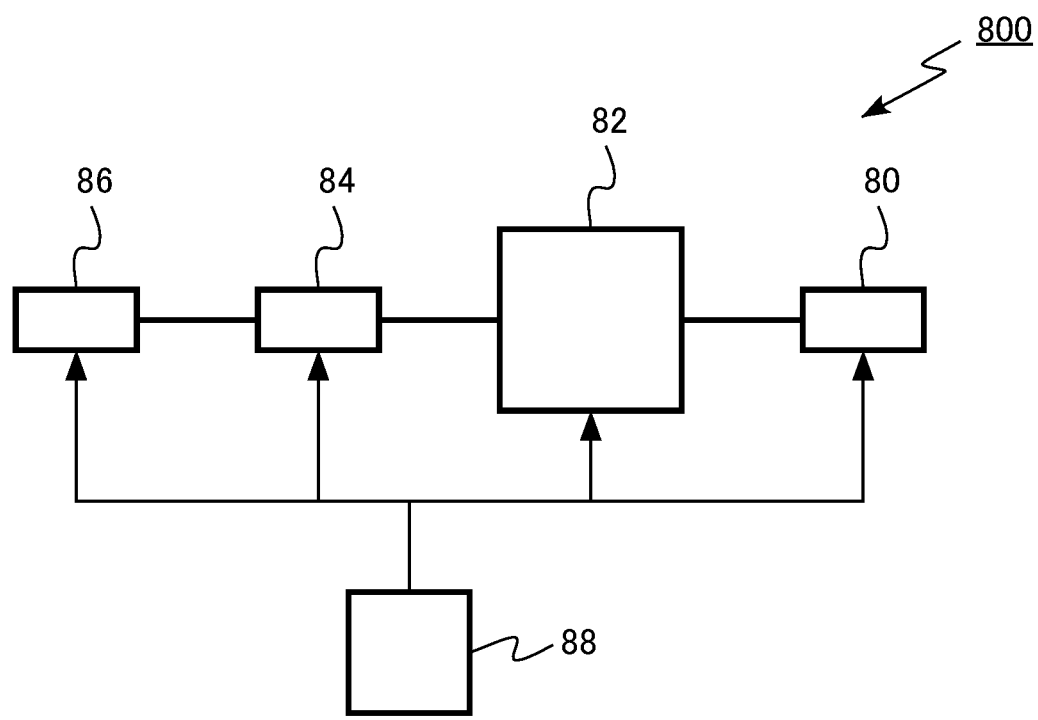
FIG. 21 is a block diagram of a superconducting apparatus according to a sixth embodiment.

FIG. 21 is a block diagram of a superconducting apparatus according to the sixth embodiment; FIG. 21 is a block diagram of a superconducting apparatus according to the sixth embodiment;

The heavy particle radiotherapy apparatus 800 includes an injection system 80, a synchrotron accelerator 82, a beam transport system 84, an irradiation system 86, and a control system 88.

The injection system 80 has, for example, a function of generating carbon ions to be used for treatment and performing preliminary acceleration for injecting the carbon ions into the synchrotron accelerator 82. The injection system 80 includes, for example, an ion generation source and a linear accelerator.

The synchrotron accelerator 82 has a function of accelerating the carbon ion beam injected from the injection system 80 to energy suitable for treatment. The superconducting coil 700 of the fifth embodiment is used for the synchrotron accelerator 82.

The beam transport system 84 has a function of transporting the carbon ion beam injected from the synchrotron accelerator 82 to the irradiation system 86. The beam transport system 84 includes, for example, a bending electromagnet.

The irradiation system 86 has a function of irradiating a patient to be irradiated with the carbon ion beam injected from the beam transport system 84. The irradiation system 86 has, for example, a rotary gantry that enables irradiation with a carbon ion beam from an arbitrary direction. The superconducting coil 700 of the fifth embodiment is used for the rotary gantry.

The control system 88 controls the injection system 80, the synchrotron accelerator 82, the beam transport system 84, and the irradiation system 86. The control system 88 is, for example, a computer.

In the heavy particle radiotherapy apparatus 800 according to the sixth embodiment, the superconducting coil 700 according to the fifth embodiment is used for the synchrotron accelerator 82 and the rotary gantry. Therefore, the heavy particle radiotherapy apparatus 800 having excellent characteristics is realized.

In the sixth embodiment, the case of the heavy particle radiotherapy apparatus 800 has been described as an example of a superconducting apparatus. However, the superconducting apparatus may be a nuclear magnetic resonance apparatus (NMR), a magnetic resonance imaging apparatus (MRI), a superconducting maglev, a superconducting aircraft, or other superconducting apparatus.

EXAMPLES

Example 1

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length of the oxide superconducting wires was 1.0 cm for one wire and 10 cm for the remaining two wires. A line of 1.6 cm was wet etched between both ends, and two lines having a length of 10 cm were wet etched at a portion of 0.8 cm from one end using a mixed solution of nitric acid, ammonia, and hydrogen peroxide to expose the oxide superconducting layer.

Powders of $Gd_2O_3$, $BaCO_3$, and CuO having a particle size of about submicron were prepared, appropriately weighed, and then sufficiently mixed using a mortar. Water and sodium alginate were added to the resulting mixed powder to prepare a slurry.

The obtained slurry was applied to the exposed oxide superconducting layer of the superconducting wire having a length of 1.0 cm, and then a portion of the superconducting wire having a length of 1.0 cm to which the slurry was applied and the exposed portion of the superconducting layer of the superconducting wire having a length of 10 cm were superposed to face each other.

A surface in contact with the superconducting wire having a length of 1.0 cm, and at a surface in contact with the superconducting wire having a length of 10 cm. The superposed wire materials were sandwiched from above and below by a jig having a flat surface above and a curvature of 250 R (1/mm) in a long axis direction below, and pressurized.

The first heat treatment was performed by heating to 780° C. in the air atmosphere while being sandwiched by the jig. Thereafter, the mixture was cooled to around room temperature, oxygen gas was introduced into the furnace, the mixture was heated to 500° C. in an oxygen atmosphere, and the second heat treatment was performed to form a connection structure of the superconducting wire.

The connection structure of the first embodiment has a same structure as the connection structure of the first embodiment illustrated in FIG. 1. The difference in thickness between the position P1 and the position P2 of the connection layer of the connection structure and the difference in thickness between the position P3 and the position P4 of the connection layer was about 50 μm.

The superconducting wire after connection was bent and fixed to a coil having a curvature of 250 R (1/mm), terminals were attached to both ends, and the temperature dependence of electric resistance was measured. A clear superconducting transition was confirmed at around 93 K and a transition width of about 1 K. With a critical current value after the superconducting transition of the connection structure of Example 1 as a reference value of 1.0, the relative critical current values are shown in Examples and Comparative Example below.

Example 2

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length of the oxide superconducting wires was 1.0 cm for one wire and 10 cm for the remaining two wires. A line of 1.6 cm was wet etched between both ends, and two lines having a length of 10 cm were wet etched at a portion of 0.8 cm from one end using a mixed solution of nitric acid, ammonia, and hydrogen peroxide to expose the oxide superconducting layer.

Powders of $Gd_2O_3$, $BaCO_3$, and CuO having a particle size of about submicron were prepared, appropriately weighed, and then sufficiently mixed using a mortar. Water and sodium alginate were added to the resulting mixed powder to prepare a slurry.

The obtained slurry was applied to the exposed oxide superconducting layer of the superconducting wire having a length of 1.0 cm, and then a portion of the superconducting wire having a length of 1.0 cm to which the slurry was applied and the exposed portion of the superconducting layer of the superconducting wire having a length of 10 cm were superposed to face each other.

A surface in contact with the superconducting wire having a length of 1.0 cm, and at a surface in contact with the superconducting wire having a length of 10 cm. The superposed wire materials were sandwiched from above and below by a jig having a flat surface above and a curvature of 500 R (1/mm) in a long axis direction below, and pressurized.

The first heat treatment was performed by heating to 780° C. in the air atmosphere while being sandwiched by the jig. Thereafter, the mixture was cooled to around room temperature, oxygen gas was introduced into the furnace, the mixture was heated to 500° C. in an oxygen atmosphere, and the second heat treatment was performed to form a connection structure of the superconducting wire.

The connection structure of Example 2 has the same structure as the connection structure of the first embodiment illustrated in FIG. 1. The difference between the thicknesses of the position P1 and the position P2 of the connection layer of the connection structure and the thickness of the position P3 and the position P4 of the connection layer was about 25 μm.

A connection structure was formed in a same manner as in Example 1 except that the curvature of the jig was different, and the superconducting wire after connection was bent and fixed to a coil having a curvature of 250 R (1/mm) in diameter, and then measurement was performed. In the connection structure of Example 2, a clear superconducting transition was confirmed at around 93 K and a transition width of about 1 K. The relative critical current value was 1.0.

Example 3

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length of the oxide superconducting wires was 1.0 cm for one wire and 10 cm for the remaining two wires. A line of 1.6 cm was wet etched between both ends, and two lines having a length of 10 cm were wet etched at a portion of 0.8 cm from one end using a mixed solution of nitric acid, ammonia, and hydrogen peroxide to expose the oxide superconducting layer.

Powders of $Gd_2O_3$, $BaCO_3$, and CuO having a particle size of about submicron were prepared, appropriately weighed, and then sufficiently mixed using a mortar. Water and sodium alginate were added to the resulting mixed powder to prepare a slurry.

The obtained slurry was applied to the exposed oxide superconducting layer of the superconducting wire having a length of 1.0 cm, and then a portion of the superconducting wire having a length of 1.0 cm to which the slurry was applied and the exposed portion of the superconducting layer of the superconducting wire having a length of 10 cm were superposed to face each other.

The superposed wire materials were sandwiched from above and below by a jig having a curvature of 250 R (1/mm) in the long axis direction at both a surface in contact with the superconducting wire having a length of 1.0 cm and a surface in contact with the superconducting wire having a length of 10 cm, and pressurized. The bending direction of the jig was set so that the surface in contact with the superconducting wire having a length of 1.0 cm and the surface in contact with the superconducting wire having a length of 10 cm were opposite to each other.

The first heat treatment was performed by heating to 780° C. in the air atmosphere while being sandwiched by the jig. Thereafter, the mixture was cooled to around room temperature, oxygen gas was introduced into the furnace, the mixture was heated to 500° C. in an oxygen atmosphere, and the second heat treatment was performed to form a connection structure of the superconducting wire.

The connection structure of Example 3 has a same structure as the connection structure of the third embodiment illustrated in FIG. 14. The difference between the thicknesses of the position P1 and the position P2 of the connection layer of the connection structure was about 100 μm.

A connection structure was formed in the same manner as in Example 1 except that the curvature of the jig was different, and the superconducting wire after connection was bent and fixed to a coil having a curvature of 250 R (1/mm), and then measurement was performed. In the connection structure of Example 3, a clear superconducting transition was confirmed at around 93 K and a transition width of about 1 K. The relative critical current value was 1.0.

Comparative Example 1

Three oxide superconducting wires in which an intermediate layer and a $GdBa_2Cu_3O_{7-\delta}$ layer (oxide superconducting layer) were formed on a Hastelloy substrate and covered with a protective layer of silver and copper were prepared. Each length of the oxide superconducting wires was 1.6 cm for one wire and 10 cm for the remaining two wires. A line of 1.6 cm was wet etched between both ends, and two lines having a length of 10 cm were wet etched at a portion of 0.8 cm from one end using a mixed solution of nitric acid, ammonia, and hydrogen peroxide to expose the oxide superconducting layer.

Powders of $Gd_2O_3$, $BaCO_3$, and CuO having a particle size of about submicron were prepared, appropriately weighed, and then sufficiently mixed using a mortar. Water and sodium alginate were added to the resulting mixed powder to prepare a slurry.

The obtained slurry was applied to the exposed oxide superconducting layer having 1.0 cm of the superconducting wire, and then a portion to which the slurry having 1.0 cm of the superconducting wire was applied and a portion to which the superconducting layer having 10 cm of the superconducting wire was exposed were superposed to face each other and sandwiched between plates. The resultant was placed in a furnace while being sandwiched between the plates, a weight was placed on the upper surface of the plate, and a load was applied to the connection portion.

The weight was placed thereon, and heated to 780° C. in the air atmosphere to perform the first heat treatment. Thereafter, the mixture was cooled to around room temperature, oxygen gas was introduced into the furnace, the mixture was heated to 500° C. in an oxygen atmosphere, and the second heat treatment was performed to form a connection structure of the superconducting wire.

The superconducting wire after connection was bent and fixed to a coil having a curvature of 250 R (1/mm), terminals were attached to both ends, and the temperature dependence of electric resistance was measured. A superconducting transition was confirmed at 93 K or less. The change in electric resistance with respect to the temperature change was gentler than that in Example 1, and the transition width was widened to about 3 K. The relative critical current value dropped to 0.8.

The connection structure of the comparative example has a same structure as the connection structure illustrated in FIG. 10 at least in a state of being fixed to the coil. The thicknesses of the position P1 and the position P2 of the connection layer of the connection structure were equal, and the thicknesses of the position P3 and the position P4 of the connection layer were equal.

Example 4

After the connection structure was formed according to the procedure of Example 1, a length of 2.0 cm including the connection structure was embedded in an epoxy resin in a state where the superconducting wire after connection was bent into a coil having a curvature of 250 R (1/mm).

Terminals were attached to both ends of the reinforced superconducting wire, and the temperature dependence of electric resistance was measured. A clear superconducting transition was confirmed at around 93 K and a transition width of about 1 K. The relative critical current value was 1.0.

The connection structure of Example 4 has a same structure as the connection structure of the fourth embodiment illustrated in FIG. 15.

In the first to fourth embodiments, the case where the conductive layer is a superconducting layer has been described as an example, but the conductive layer may be, for example, a normal conducting layer. For example, in the case of a conductive layer having low resistance to bending stress like an oxide normal conducting layer, the same connection structure as in the first to fourth embodiments is effective.

In the first to fourth embodiments, the case where the first connection layer 41 and the second connection layer 42 are superconducting layers has been described as an example, but the conductive layer may be, for example, a normal conducting layer. The first connection layer 41 and the second connection layer 42 may be, for example, metal layers such as solder.

In the fifth embodiment, the superconducting coil has been described as an example, but instead of the superconducting coil, a coil not having superconducting material can be used.

In the sixth embodiment, the superconducting apparatus has been described as an example, but instead of the superconducting apparatus, an apparatus not using superconducting material can be used.

While certain embodiments have been described, these embodiments have been presented by way of example only, and are not intended to limit the scope of the inventions. Indeed, the connection structure of conductive layers, the conductive wire, the coil, and the apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A connection structure of conductive layers comprising:
    a first conductive member including a first conductive layer and a first substrate supporting the first conductive layer, the first conductive member extending in a first direction, the first conductive member being curved in the first direction such that the first conductive layer side is convex;
    a second conductive member including a second conductive layer and a second substrate supporting the second conductive layer, the second conductive member extending in the first direction, the second conductive member being curved in the first direction such that the second conductive layer side is convex;
    a third conductive member including a third conductive layer and a third substrate, the third conductive layer having a first surface and a second surface facing the first surface, the first surface facing a convex side of the first conductive layer and a convex side of the second conductive layer, the third substrate opposed to the second surface and supporting the third conductive layer, the third conductive member extending in the first direction;
    a first connection layer existing between a convex side of the first conductive layer and the third conductive layer, the first connection layer having a thickness at a first position thinner than a thickness at a second position, a distance between the second position and the second conductive layer is larger than a distance between the first position and the second conductive layer; and
    a second connection layer existing between a convex side of the second conductive layer and the third conductive layer, the second connection layer having a thickness at a third position thinner than a thickness at a fourth position, a distance between the fourth position and the first conductive layer is larger than a distance between the third position and the first conductive layer.

2. The connection structure of conductive layers according to claim 1, wherein the first conductive layer, the second conductive layer, and the third conductive layer are superconducting layers.

3. The connection structure of conductive layers according to claim 1, wherein the first conductive layer, the second conductive layer, and the third conductive layer are oxide superconducting layers containing a rare earth element (RE), barium (Ba), copper (Cu), and oxygen (O).

4. The connection structure of conductive layers according to claim 1, wherein the first connection layer and the second connection layer contain a rare earth element (RE), barium (Ba), copper (Cu), and oxygen (O).

5. The connection structure of conductive layers according to claim 1, wherein the first position is a position between an end of the first conductive layer on a side facing the second conductive layer and the third conductive layer, and the second position is a position between an end of the third conductive layer on a side facing the first conductive layer and the first conductive layer, and
    the third position is a position between an end portion of the second conductive layer on a side facing the first conductive layer and the third conductive layer, and the fourth position is a position between an end portion of the third conductive layer on a side facing the second conductive layer and the second conductive layer.

6. The connection structure of conductive layers according to claim 1, wherein a thickness of the first connection layer monotonously increases from the first position toward the second position, and
    a thickness of the second connection layer monotonously increases from the third position toward the fourth position.

7. The connection structure of conductive layers according to claim 1, wherein the third conductive member is curved in the first direction such that a side of the third conductive layer is concave.

8. The connection structure of conductive layers according to claim 7, wherein a curvature radius of the third conductive member is larger than a curvature radius of the first conductive member and a curvature radius of the second conductive member.

9. The connection structure of conductive layers according to claim 1, wherein the third conductive member is curved in the first direction such that a side of the third conductive layer is convex.

10. The connection structure of conductive layers according to claim 1, wherein a thickness of the first connection layer at the second position is twice or more a thickness of the first connection layer at the first position, and
    a thickness of the second connection layer at the fourth position is twice or more a thickness of the second connection layer at the third position.

11. The connection structure of conductive layers according to claim 1, wherein the first connection layer and the second connection layer are continuous.

12. The connection structure for conductive layers according to claim 1, further comprising a reinforcing material existing between the first conductive member and the second conductive member.

13. The connection structure of conductive layers according to claim 12, wherein the reinforcing material surrounds the first conductive member, the second conductive member, and the third conductive member.

14. A conductive wire comprising the connection structure of conductive layers according to claim 1.

15. A coil comprising the conductive wire according to claim 14.

16. An apparatus comprising the coil according to claim 15.

* * * * *